US012695051B2

(12) United States Patent
Wang

(10) Patent No.: US 12,695,051 B2
(45) Date of Patent: Jul. 28, 2026

(54) SENSING ELEMENT LEVEL CIRCUITRY DESIGN FOR ELECTRON COUNTING DETECTION DEVICE

(71) Applicant: ASML Netherlands B.V., Veldhoven (NL)

(72) Inventor: Yongxin Wang, San Ramon, CA (US)

(73) Assignee: ASML Netherlands B.V., Veldhoven (NL)

( * ) Notice: Subject to any disclaimer, the term of this patent is extended or adjusted under 35 U.S.C. 154(b) by 735 days.

(21) Appl. No.: 18/005,031

(22) PCT Filed: Jul. 6, 2021

(86) PCT No.: PCT/EP2021/068676
§ 371 (c)(1),
(2) Date: Jan. 10, 2023

(87) PCT Pub. No.: WO2022/008518
PCT Pub. Date: Jan. 13, 2022

(65) Prior Publication Data
US 2023/0335372 A1 Oct. 19, 2023

Related U.S. Application Data

(60) Provisional application No. 63/151,585, filed on Feb. 19, 2021, provisional application No. 63/113,171, (Continued)

(51) Int. Cl.
*H01J 37/244* (2006.01)
*G01N 23/2251* (2018.01)

(52) U.S. Cl.
CPC ........ *H01J 37/244* (2013.01); *G01N 23/2251* (2013.01); *H01J 2237/2441* (2013.01)

(58) Field of Classification Search
CPC ........... H01J 37/244; H01J 2237/2441; G01N 23/2251; G01N 2223/302;
(Continued)

(56) References Cited

U.S. PATENT DOCUMENTS 3,609,312 A * 9/1971 Higgins ................ F41G 7/2266
340/146.2
9,691,586 B2 6/2017 Ren et al.
(Continued)

FOREIGN PATENT DOCUMENTS

EP 0912043 A2 * 4/1999 ........... H04N 25/533
EP 1595119 B1 * 8/2010 ........... H04N 25/766
(Continued)

OTHER PUBLICATIONS

International Search Report issued in related PCT International Application No. PCT/EP2021/068676; mailed Oct. 26, 2021 (5 pgs.).
(Continued)

*Primary Examiner* — David A Vanore
(74) *Attorney, Agent, or Firm* — Finnegan, Henderson, Farabow, Garrett & Dunner LLP

(57) ABSTRACT
A charged particle beam detector may include a circuit with a storage cell configured to receive a signal representing an output of a sensing element; a storage cell multiplexer configured to selectively transmit the signal representing the output of the sensing element to the storage cell; a threshold detector configured to compare the signal representing the output of the sensing element to a threshold; and a converter configured to perform signal processing on a signal transmitted from the storage cell.

20 Claims, 23 Drawing Sheets

Related U.S. Application Data filed on Nov. 12, 2020, provisional application No. 63/050,628, filed on Jul. 10, 2020.

(58) Field of Classification Search
CPC ....... G01N 2223/304; G01N 2223/306; G01N 2223/418; H04N 25/00; H04N 25/771; H04N 25/773
See application file for complete search history.

(56) References Cited

U.S. PATENT DOCUMENTS

| | | | | |
|---|---|---|---|---|
| 11,310,282 | B1 * | 4/2022 | Zhang | H04L 63/1425 |
| 2011/0036989 | A1 | 2/2011 | Marks et al. | |
| 2014/0175279 | A1 | 6/2014 | Agemura | |
| 2019/0304742 | A1 | 10/2019 | Han et al. | |
| 2019/0378682 | A1 * | 12/2019 | Wang | G01T 1/247 |
| 2020/0027694 | A1 * | 1/2020 | Wang | G01N 23/2251 |
| 2020/0219696 | A1 * | 7/2020 | Wang | H10F 39/803 |
| 2020/0227229 | A1 * | 7/2020 | Wang | H01J 37/244 |
| 2020/0273664 | A1 * | 8/2020 | Wang | H10F 39/107 |
| 2020/0286708 | A1 * | 9/2020 | Wang | H01J 37/244 |
| 2023/0178328 | A1 * | 6/2023 | Wang | H01J 37/28 |
| | | | | 250/396 R |
| 2023/0215685 | A1 * | 7/2023 | Wang | H01J 37/244 |
| | | | | 250/397 |
| 2023/0335372 | A1 * | 10/2023 | Wang | H04N 25/773 |

FOREIGN PATENT DOCUMENTS

| | | | | |
|---|---|---|---|---|
| EP | 2852154 | A2 | 3/2015 | |
| JP | 2019087407 | A | 6/2019 | |
| KR | 10-1448075 | B1 | 10/2014 | |
| TW | I419196 | B | 12/2013 | |
| TW | 201730545 | A | 9/2017 | |
| TW | 201734428 | A | 10/2017 | |
| TW | 201827823 | A | 8/2018 | |
| WO | WO-2007115312 | A2 * | 10/2007 | ............... G01J 3/10 |

OTHER PUBLICATIONS

Office Action issued in related Taiwanese Patent Application No. 110123053; mailed Jul. 5, 2022 (15 pgs.).

Anghinolfi Fet Al: Monolithic CMOS Front-End Electronics With Analog Pipelining; 1990 IEE Nuclear Science Symposium Conference Record. Arlington, Oct. 22-27, 1990; [Proceedings of The Nuclear Science Symposium], New York, IEEE, US, vol. 1 of 02, Oct. 22, 1990 (Oct. 22, 1990).

\* cited by examiner

10

100A

300A

300B

300C

400

400B

600

8000

8200

8300

SENSING ELEMENT LEVEL CIRCUITRY DESIGN FOR ELECTRON COUNTING DETECTION DEVICE

CROSS-REFERENCE TO RELATED APPLICATIONS

This application claims priority to International Application No. PCT/EP2021/068676, filed Jul. 6, 2021, and published as WO 2022/008518 A1, which claims priority of U.S. application 63/050,628 which was filed on Jul. 10, 2020, and U.S. application 63/113,171 which was filed on Nov. 12, 2020, and U.S. application 63/151,585 which was filed on Feb. 19, 2021. The contents of these applications are incorporated herein by reference in their entireties.

FIELD

The description herein relates to detectors that may be useful in the field of charged particle beam systems, and more particularly, to systems and methods that may be applicable to charged particle detection using charged particle counting.

BACKGROUND

Detectors may be used for sensing physically observable phenomena. For example, charged particle beam tools, such as electron microscopes, may comprise detectors that receive charged particles projected from a sample and that output detection signals. Detection signals may be used to reconstruct images of sample structures under inspection and may be used, for example, to reveal defects in the sample. Detection of defects in a sample is increasingly important in the manufacturing of semiconductor devices, which may include large numbers of densely packed, miniaturized integrated circuit (IC) components. Inspection systems may be provided for this purpose.

With continuing miniaturization of semiconductor devices, inspection systems may use lower and lower beam currents in charged particle beam tools. Existing detection systems may be limited by signal-to-noise ratio (SNR) and system throughput, particularly when beam current reduces to, for example, pico-ampere ranges. Electron counting has been proposed to enhance SNR and to increase throughput in electron beam inspection systems, wherein the intensity of an incoming electron beam is acquired by counting the number of electrons that reach the detector, and then analyzing the frequency of electron arrival events. However, basic circuitry to implement electron counting may face difficulties due to the stochastic (e.g., random) nature of electron arrival events and may encounter high miscounting rates. Improvements in detection systems and methods are thus desired.

SUMMARY

Embodiments of the present disclosure provide systems and methods for detection based on charged particle beams. In some embodiments, there may be provided a charged particle beam system that includes a detector. The detector may include a circuit that may be useful for counting charged particles. The circuit may include a storage cell configured to receive a signal representing an output of a sensing element; a storage cell multiplexer configured to selectively transmit the signal representing the output of the sensing element to the storage cell; a threshold detector configured to compare the signal representing the output of the sensing element to a threshold; and a converter configured to perform signal processing on a signal transmitted from the storage cell.

It is to be understood that both the foregoing general description and the following detailed description are exemplary and explanatory only and are not restrictive of the disclosed embodiments, as may be claimed.

BRIEF DESCRIPTION OF THE DRAWINGS

The above and other aspects of the present disclosure will become more apparent from the description of exemplary embodiments, taken in conjunction with the accompanying drawings.

DETAILED DESCRIPTION

Figure 1:
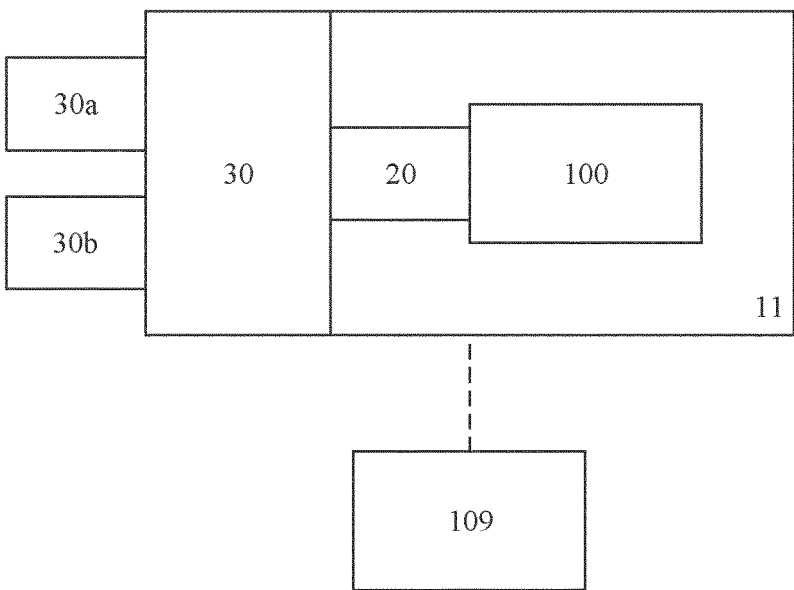
FIG. 1 is a diagrammatic representation of an exemplary electron beam inspection (EBI) system, consistent with embodiments of the present disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to subject matter that may be recited in the appended claims.

Electronic devices are constructed of circuits formed on a piece of silicon called a substrate. Many circuits may be formed together on the same piece of silicon and are called integrated circuits or ICs. With advancements in technology, the size of these circuits has decreased dramatically so that many more of them can fit on the substrate. For example, an IC chip in a smart phone can be as small as a fingernail and yet may include over 2 billion transistors, the size of each transistor being less than $\frac{1}{1,000}$th the width of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur. To enhance throughput (e.g., the number of samples processed per hour), it is desirable to conduct inspection as quickly as possible.

An image of a wafer may be formed by scanning a primary beam of a SEM system (e.g., a "probe" beam) over the wafer and collecting particles (e.g., secondary electrons) generated from the wafer surface at a detector. Secondary electrons may form a beam (a "secondary beam") that is directed toward the detector. Secondary electrons landing on the detector may cause electrical signals (e.g., current, charge, voltage, etc.) to be generated in the detector. These signals may be output from the detector and may be processed by an image processor to form the image of the sample.

Typically, the detection process involves measuring the magnitude of an electrical signal generated when electrons land on the detector. In another approach, electron counting may be used, in which a detector may count individual electron arrival events as they occur. In either approach, intensity of the secondary beam may be determined based on electrical signals generated in the detector that vary in proportion to the change in intensity of the secondary beam. Using electron counting, however, the discrete numbers of electrons that reach the detector from a beam of secondary electrons may be determined and detection results may be output in digital form (e.g., 1s and 0s rather than an analog signal). The intensity of the beam may be determined by analyzing the frequency of electron arrival events.

Electron counting may be helpful to improve signal-to-noise ratio (SNR) and throughput of a charged particle beam system. SNR may be a concern especially at low levels of primary beam current. Thus, electron counting may be an attractive method in applications such as metrology and overlay inspections where beam current is usually low. Electron counting may also be useful in separating signals generated by different types of electrons (e.g., secondary electrons and backscattered electrons). In some applications, it may be desired to generate SEM images based purely on secondary electrons, images based purely on backscattered electrons, or images based on a combination.

However, it may be difficult to implement electron counting using conventional circuitry due to bandwidth limitations and the random nature of electron arrival events, and thus basic circuits may encounter high miscounting rates. Electrons may be emitted from a sample in random directions and with varying levels of energy. Electrons arriving at a sensing element of a detector may occur in such close succession that the arrival of two electrons is miscounted as one electron arrival event. A simple combination of, for example, voltage comparators and logical circuits may be unable to achieve the desired goals of an electron counting detection system with high accuracy and low miscount rate. Additionally, a detector should have the ability to discriminate particles of differing energy, so as to, for example, discriminate between secondary and backscattered electrons. Some circuit designs may not be able to collect information about electron arrival events with sufficient accuracy, and may have poor energy discrimination accuracy.

Embodiments of the disclosure may provide systems and methods for detection that enable charged particle counting in a detector. There may be a layer of circuitry provided in a detector that is configured for charged particle counting. Circuitry may be provided in a separate read-out layer of a semiconductor chip making up the detector, in a separate semiconductor chip, or integrated together with sensing elements, for example. In a detector that is made up of layers including a sensing element layer and a signal processing layer, a circuit may be provided in the signal processing layer that processes signals generated by sensing elements and transforms them to digital signals. The circuit may be configured to temporarily store signals related to the energy of incident charged particles. The circuit may be configured to allow output signals to be generated that are representative of the number of charged particles arriving at a sensing element in a period (e.g., to confirm an electron arrival event), the energy associated with the charged particles (e.g., to distinguish between secondary or backscattered electrons), and whether more than a certain number of charged particles arrived in the period (e.g., to determine an overflow status of a sensing element).

The circuit may act as a memory or a pipeline to store or process information relating to charged particle arrival events. A "pipeline" approach to a circuit may refer to a circuit architecture configured to decompose a sequential process into several subprocesses. The subprocesses may be performed in parallel, similar to an assembly line where workers at individual stages perform a specific task and pass a partially completed product to the next worker down the line. A circuit that acts as a memory or pipeline may enhance the ability of the detector to process signals. For example, signal processing of electron arrival events may take a certain amount of time. The arrival rate of electrons using, for example, a beam of 1 nA current may correspond to about 6.25 billion secondary electrons arriving at a detector in one second (meaning an electron arrives about once every few nanoseconds). The signal processing rate of the detector may be slower than the temporal rate at which the detector is able to generate measurable signals in response to electron arrival events, and thus, miscounting or other difficulties may occur. By providing a memory function, a detector may have added capacity to record signals to temporarily represent individual electron arrival events, and may process them for output simultaneously or at a different time (e.g., "asynchronously").

Furthermore, fast circuit processing speed alone may not be enough to ensure accurate electron counting. Due to the random nature of electron arrival events, even if the processing rate of a circuit is higher than the average rate at which a sensing element generates signals in response to electron arrival events ("average rate"), a detector may still encounter issues in electron counting. For example, if no analog pipeline is provided, even if the temporal rate at which a sensing element generates signals in response to an electron arrival event is higher than the average rate, there may still be instances where two electrons arrive in close succession and the detector is not able to process the events accurately. On the other hand, if the processing rate of the circuit is lower than the average rate, the circuit may constantly be in an overflow state. Embodiments of the disclosure may address this situation by (1) adding an analog pipeline in a detection circuit to reduce or minimize miscounts due to processing rate; and (2) providing converters in the processing circuit to ensure that the overall processing rate of the circuit is higher than the average rate at which a sensing element generates signals in response to an electron arrival event. The analog pipeline may reduce or minimize miscounts that are due to the processing rate of a single converter being lower than the temporal rate at which a sensing element generates signals in response to electron arrival events. The multiple converters may ensure a certain degree of improvement in processing rate within a certain probe current range over the average rate at which a sensing element generates signals in response to electron arrival events.

Objects and advantages of the disclosure may be realized by the elements and combinations as set forth in the embodiments discussed herein. However, embodiments of the present disclosure are not necessarily required to achieve such exemplary objects or advantages, and some embodiments may not achieve any of the stated objects or advantages.

Without limiting the scope of the present disclosure, some embodiments may be described in the context of providing detection systems and detection methods in systems utilizing electron beams ("e-beams"). However, the disclosure is not so limited. Other types of charged particle beams may be similarly applied. Furthermore, systems and methods for detection may be used in other imaging systems, such as optical imaging, photon detection, x-ray detection, ion detection, etc. Additionally, the term "beamlet" may refer to a constituent part of a beam or a separate beam extracted from an original beam. The term "beam" may refer to beams or beamlets.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 10 that may be used for wafer inspection, consistent with embodiments of the present disclosure. As shown in FIG. 1, EBI system 10 includes a main chamber 11 a load/lock chamber 20, an electron beam tool 100 (e.g., a scanning electron microscope (SEM)), and an equipment front end module (EFEM) 30. Electron beam tool 100 is located within main chamber 11 and may be used for imaging. EFEM 30 includes a first loading port 30a and a second loading port 30b. EFEM 30 may include additional loading ports. First loading port 30a and second loading port 30b receive wafer front opening unified pods (FOUPs) that contain wafers (e.g., semiconductor wafers or wafers made of other materials) or samples to be inspected (wafers and samples may be collectively referred to as "wafers" herein).

One or more robotic arms (not shown) in EFEM 30 may transport the wafers to load/lock chamber 20. Load/lock chamber 20 is connected to a load/lock vacuum pump system (not shown) which removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown) which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 109 is electronically connected to electron beam tool 100, and may be electronically connected to other components as well. Controller 109 may be a computer configured to execute various controls of EBI system 10. While controller 109 is shown in FIG. 1 as being outside of the structure that includes main chamber 11, load/lock chamber 20, and EFEM 30, it is appreciated that controller 109 can be part of the structure.

A charged particle beam microscope, such as that formed by or which may be included in EBI system 10, may be capable of resolution down to, e.g., the nanometer scale, and may serve as a practical tool for inspecting IC components on wafers. With an e-beam system, electrons of a primary electron beam may be focused at probe spots on a wafer under inspection. The interactions of the primary electrons with the wafer may result in secondary particle beams being formed. The secondary particle beams may comprise backscattered electrons, secondary electrons, or Auger electrons, etc. resulting from the interactions of the primary electrons with the wafer. Characteristics of the secondary particle beams (e.g., intensity) may vary based on the properties of the internal or external structures or materials of the wafer, and thus may indicate whether the wafer includes defects.

The intensity of the secondary particle beams may be determined using a detector. The secondary particle beams may form beam spots on a surface of the detector. The detector may generate electrical signals (e.g., a current, a charge, a voltage, etc.) that represent intensity of the detected secondary particle beams. The electrical signals may be measured with measurement circuitries which may include further components (e.g., analog-to-digital converters) to obtain a distribution of the detected electrons. The electron distribution data collected during a detection time window, in combination with corresponding scan path data of the primary electron beam incident on the wafer surface, may be used to reconstruct images of the wafer structures or materials under inspection. The reconstructed images may be used to reveal various features of the internal or external structures or materials of the wafer and may be used to reveal defects that may exist in the wafer.

Figure 2A:
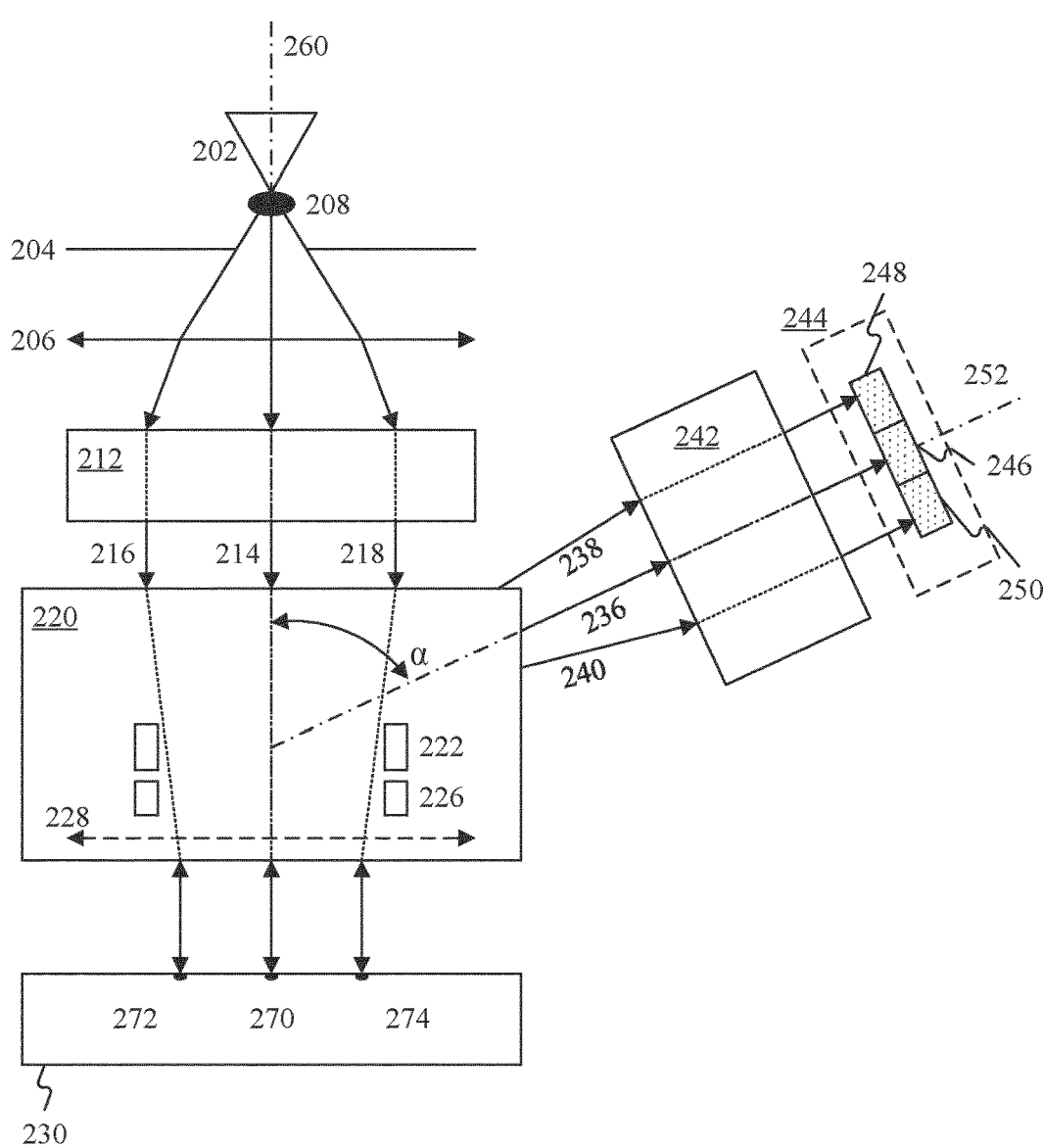
FIGS. 2A and 2B are diagrams illustrating a charged particle beam apparatus that may be an example of an electron beam tool, consistent with embodiments of the present disclosure.

FIG. 2A illustrates a charged particle beam apparatus that may be an example of electron beam tool 100, consistent with embodiments of the present disclosure. FIG. 2A shows an apparatus that uses a plurality of beamlets formed from a primary electron beam to simultaneously scan multiple locations on a wafer.

As shown in FIG. 2A, electron beam tool 100A may comprise an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2A), multiple secondary electron beams 236, 238, and 240, a secondary optical system 242, and electron detection device 244. Electron source 202 may generate primary particles, such as electrons of primary electron beam 210. A controller, image processing system, and the like may be coupled to electron detection device 244. Primary projection optical system 220 may comprise beam separator 222, deflection scanning unit 226, and objective lens 228. Electron detection device 244 may comprise detection sub-regions 246, 248, and 250.

Electron source 202, gun aperture 204, condenser lens 206, source conversion unit 212, beam separator 222, deflection scanning unit 226, and objective lens 228 may be aligned with a primary optical axis 260 of apparatus 100A. Secondary optical system 242 and electron detection device 244 may be aligned with a secondary optical axis 252 of apparatus 100A.

Electron source 202 may comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 may block off peripheral electrons of primary electron beam 210 to reduce size of probe spots 270, 272, and 274.

Source conversion unit 212 may comprise an array of image-forming elements (not shown in FIG. 2A) and an array of beam-limit apertures (not shown in FIG. 2A). An example of source conversion unit 212 may be found in U.S. Pat. No. 9,691,586; U.S. Publication No. 2017/0025243; and International Application No. PCT/EP2017/084429, all of which are incorporated by reference in their entireties. The array of image-forming elements may comprise an array of micro-deflectors or micro-lenses. The array of image-forming elements may form a plurality of parallel images (virtual or real) of crossover 208 with a plurality of beamlets 214, 216, and 218 of primary electron beam 210. The array of beam-limit apertures may limit the plurality of beamlets 214, 216, and 218.

Condenser lens 206 may focus primary electron beam 210. The electric currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Condenser lens 206 may be an adjustable condenser lens that may be configured so that the position of its first principle plane is movable. The adjustable condenser lens may be configured to be magnetic, which may result in off-axis beamlets 216 and 218 landing on the beamlet-limit apertures with rotation angles. The rotation angles change with the focusing power and the position of the first principal plane of the adjustable condenser lens. In some embodiments, the adjustable condenser lens may be an adjustable anti-rotation condenser lens, which involves an anti-rotation lens with a movable first principal plane. An example of an adjustable condenser lens is further described in U.S. Publication No. 2017/0025241, which is incorporated by reference in its entirety.

Objective lens 228 may focus beamlets 214, 216, and 218 onto a wafer 230 for inspection and may form a plurality of probe spots 270, 272, and 274 on the surface of wafer 230. Secondary electron beamlets 236, 238, and 240 may be formed that are emitted from wafer 230 and travel back toward beam separator 222.

Beam separator 222 may be a beam separator of Wien filter type generating an electrostatic dipole field and a magnetic dipole field. In some embodiments, if they are applied, the force exerted by electrostatic dipole field on an electron of beamlets 214, 216, and 218 may be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 may also be non-zero. Beam separator 222 may separate secondary electron beams 236, 238, and 240 from beamlets 214, 216, and 218 and direct secondary electron beams 236, 238, and 240 towards secondary optical system 242.

Deflection scanning unit 226 may deflect beamlets 214, 216, and 218 to scan probe spots 270, 272, and 274 over an area on a surface of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 may comprise electrons with a distribution of energies including secondary electrons and backscattered electrons. Secondary optical system 242 may focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of the surface of wafer 230. Detection sub-regions 246, 248, and 250 may include separate detector packages, separate sensing elements, or separate regions of an array detector. In some embodiments, each detection sub-region may include a single sensing element.

Another example of a charged particle beam apparatus will now be discussed with reference to FIG. 2B. An electron beam tool 100B (also referred to herein as apparatus 100B) may be an example of electron beam tool 100 and may be similar to electron beam tool 100A shown in FIG. 2A. However, different from apparatus 100A, apparatus 100B may be a single-beam tool that uses only one primary electron beam to scan one location on the wafer at a time.

Figure 2B:
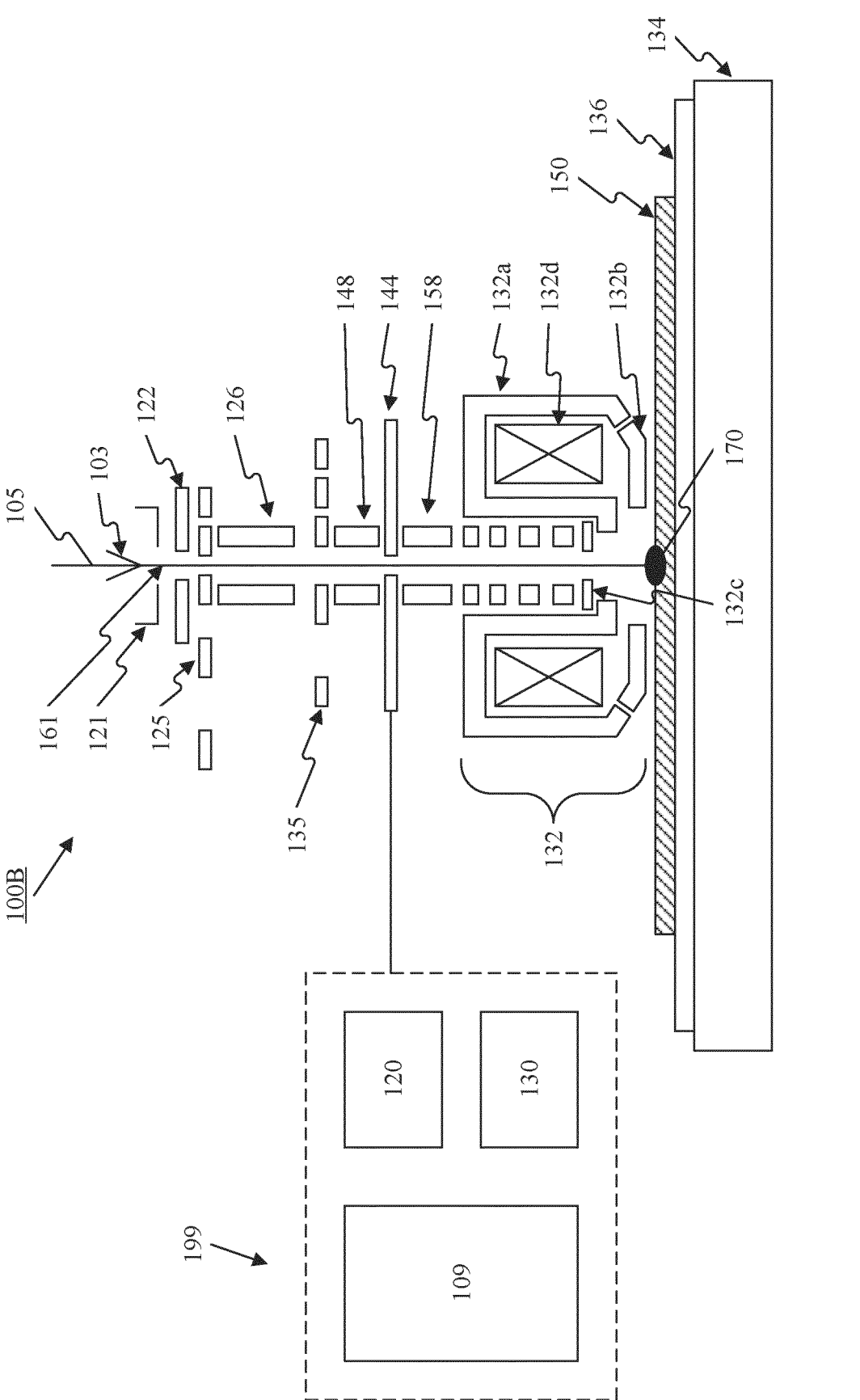

As shown in FIG. 2B, apparatus 100B includes a wafer holder 136 supported by motorized stage 134 to hold a wafer 150 to be inspected. Electron beam tool 100B includes an electron emitter, which may comprise a cathode 103, an anode 121, and a gun aperture 122. Electron beam tool 100B further includes a beam limit aperture 125, a condenser lens 126, a column aperture 135, an objective lens assembly 132, and a detector 144. Objective lens assembly 132, in some embodiments, may be a modified SORIL lens, which includes a pole piece 132a, a control electrode 132b, a deflector 132c, and an exciting coil 132d. In a detection or imaging process, an electron beam 161 emanating from the tip of cathode 103 may be accelerated by anode 121 voltage, pass through gun aperture 122, beam limit aperture 125, condenser lens 126, and be focused into a probe spot 170 by the modified SORIL lens and impinge onto the surface of wafer 150. Probe spot 170 may be scanned across the surface of wafer 150 by a deflector, such as deflector 132c or other deflectors in the SORIL lens. Secondary or scattered particles, such as secondary electrons or scattered primary electrons emanated from the wafer surface may be collected by detector 144 to determine intensity of the beam and so that an image of an area of interest on wafer 150 may be reconstructed.

There may also be provided an image processing system 199 that includes an image acquirer 120, a storage 130, and controller 109. Image acquirer 120 may comprise one or more processors. For example, image acquirer 120 may comprise a computer, server, mainframe host, terminals, personal computer, any kind of mobile computing devices, and the like, or a combination thereof. Image acquirer 120 may connect with detector 144 of electron beam tool 100B through a medium such as an electrical conductor, optical fiber cable, portable storage media, IR, Bluetooth, internet, wireless network, wireless radio, or a combination thereof. Image acquirer 120 may receive a signal from detector 144 and may construct an image. Image acquirer 120 may thus acquire images of wafer 150. Image acquirer 120 may also perform various post-processing functions, such as image averaging, generating contours, superimposing indicators on an acquired image, and the like. Image acquirer 120 may be configured to perform adjustments of brightness and contrast, etc. of acquired images. Storage 130 may be a storage medium such as a hard disk, random access memory (RAM), cloud storage, other types of computer readable memory, and the like. Storage 130 may be coupled with image acquirer 120 and may be used for saving scanned raw image data as original images, and post-processed images. Image acquirer 120 and storage 130 may be connected to controller 109. In some embodiments, image acquirer 120, storage 130, and controller 109 may be integrated together as one electronic control unit.

In some embodiments, image acquirer 120 may acquire one or more images of a sample based on an imaging signal received from detector 144. An imaging signal may correspond to a scanning operation for conducting charged particle imaging. An acquired image may be a single image comprising a plurality of imaging areas that may contain various features of wafer 150. The single image may be stored in storage 130. Imaging may be performed on the basis of imaging frames.

The condenser and illumination optics of the electron beam tool may comprise or be supplemented by electromagnetic quadrupole electron lenses. For example, as shown in FIG. 2B, electron beam tool 100B may comprise a first quadrupole lens 148 and a second quadrupole lens 158. In some embodiments, the quadrupole lenses may be used for controlling the electron beam. For example, first quadrupole lens 148 may be controlled to adjust the beam current and second quadrupole lens 158 may be controlled to adjust the beam spot size and beam shape.

FIG. 2B illustrates a charged particle beam apparatus that may use a single primary beam configured to generate secondary electrons by interacting with wafer 150. Detector 144 may be placed along optical axis 105, as in the embodiment shown in FIG. 2B. The primary electron beam may be configured to travel along optical axis 105. Accordingly, detector 144 may include a hole at its center so that the primary electron beam may pass through to reach wafer 150. FIG. 2B shows an example of detector 144 having an opening at its center. However, some embodiments may use a detector placed off-axis relative to the optical axis along which the primary electron beam travels. For example, as in the embodiment shown in FIG. 2A, discussed above, a beam separator 222 may be provided to direct secondary electron beams toward a detector placed off-axis. Beam separator 222 may be configured to divert secondary electron beams by an angle α toward an electron detection device 244, as shown in FIG. 2A.

A detector in a charged particle beam system may include one or more sensing elements. The detector may comprise a single-element detector or an array with multiple sensing elements. The sensing elements may be configured for charged particle counting. Sensing elements of a detector that may be useful for charged particle counting are discussed in U.S. Publication No. 2019/0378682, which is incorporated by reference in its entirety.

Sensing elements may include a diode or an element similar to a diode that may convert incident energy into a measurable signal. For example, sensing elements in a detector may include a PIN diode. Throughout this disclosure, sensing elements may be represented as a diode, for example in the figures, although sensing elements or other components may deviate from ideal circuit behavior of electrical elements such as diodes, resistors, capacitors, etc.

Figure 3A:
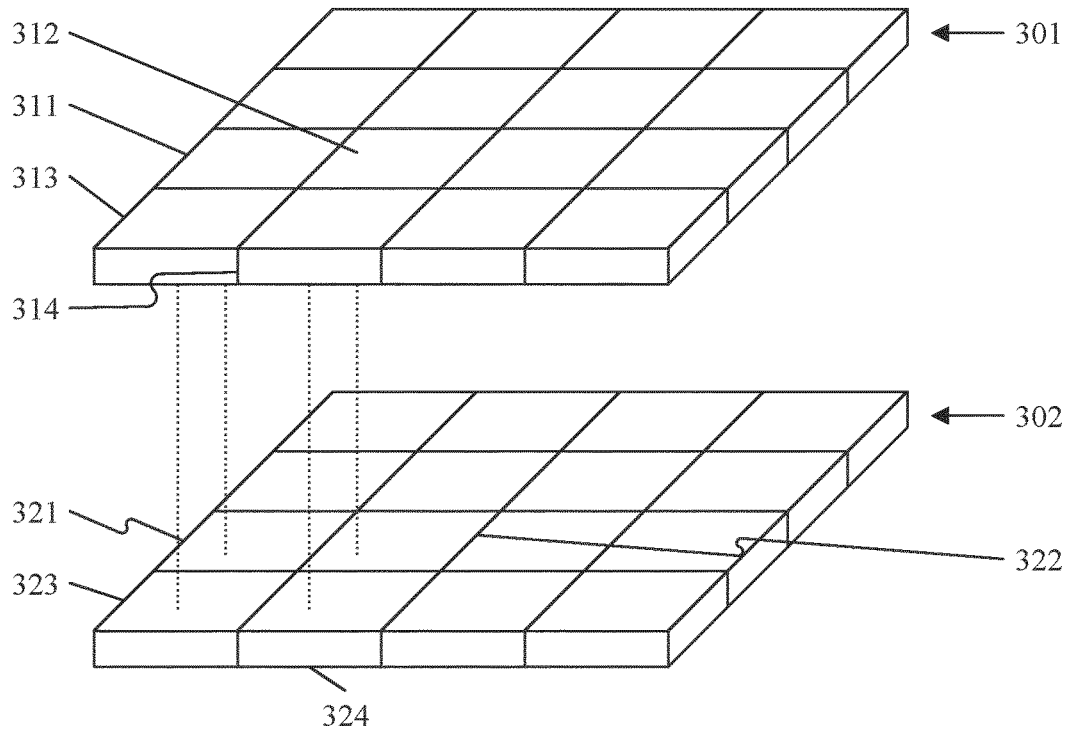
FIGS. 3A-3C are diagrammatic representations of an exemplary structure of a detector, consistent with embodiments of the present disclosure.
Figure 3B:
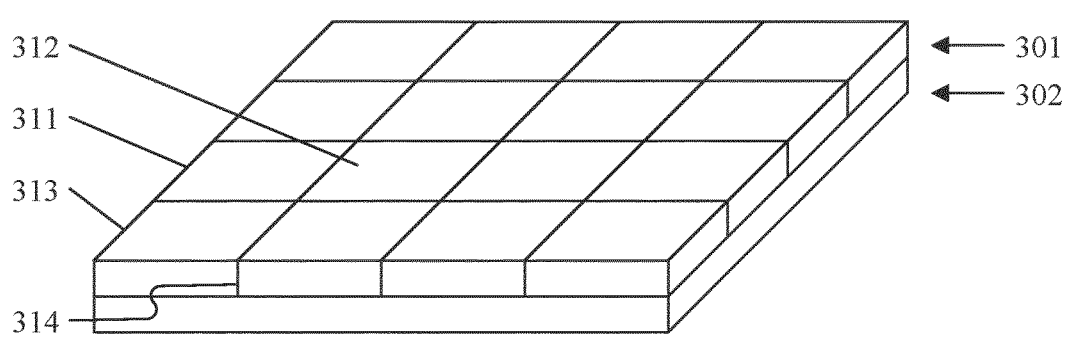
Figure 3C:
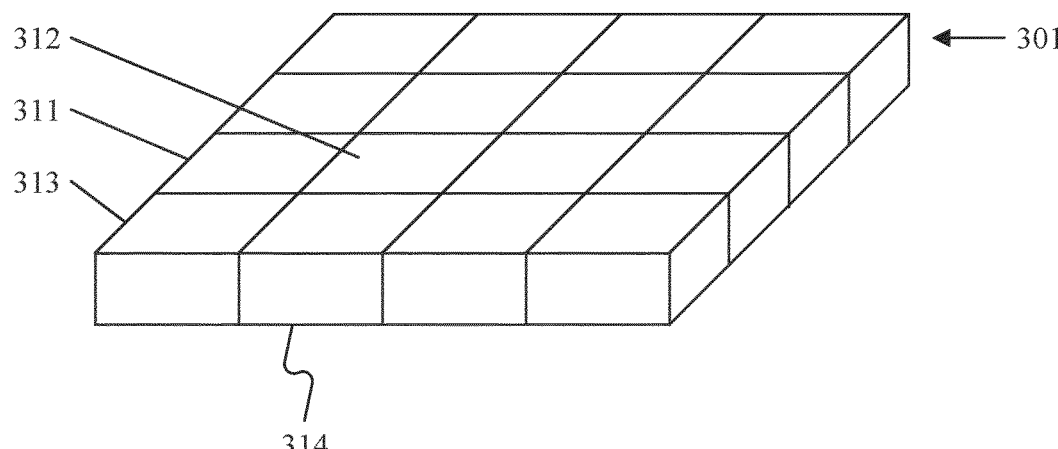

FIGS. 3A-3C illustrate exemplary structures of a detector, consistent with embodiments of the present disclosure. The detector may be a segmented detector. A detector such as detector 300A, detector 300B, or detector 300C as shown in FIGS. 3A-3C may be provided as charged-particle detection device 244 as shown in FIG. 2A or detector 144 as shown in FIG. 2B. In FIG. 3A, detector 300A includes a sensor layer 301 and a signal processing layer 302. Sensor layer 301 may include a sensor die made up of multiple sensing elements, including sensing elements 311, 312, 313, and 314. In some embodiments, the multiple sensing elements may be provided in an array of sensing elements, each of which may have a uniform size, shape, and arrangement.

Signal processing layer 302 may include multiple signal processing circuits, including circuits 321, 322, 323, and 324. The circuits may include interconnections (e.g., wiring paths) configured to communicatively couple sensing elements. Each sensing element of sensor layer 301 may have a corresponding signal processing circuit in signal processing layer 302. Sensing elements and their corresponding circuits may be configured to operate independently. As shown in FIG. 3A, circuits 321, 322, 323, and 324 may be configured to communicatively couple to outputs of sensing elements 311, 312, 313, and 314, respectively, as shown by the four dashed lines between sensor layer 301 and signal processing layer 302.

In some embodiments, signal processing layer 302 may be configured as a single die with multiple circuits provided thereon. Sensor layer 301 and signal processing layer 302 may be in direct contact. For example, as shown in FIG. 3B, which shows detector 300B, signal processing layer 302 directly abut sensor layer 301.

In some embodiments, components and functionality of different layers may be combined or omitted. For example, signal processing layer 302 may be combined with sensor layer 301. Furthermore, a circuit for charged particle counting may be integrated at various points in a detector, for example in a separate read-out layer of a detector or on a separate chip.

As shown in FIG. 3C, a detector 300C may be provided. Detector 300C may include sensor layer 301. Detector 300C may be configured for back-side illumination, and sensor layer 301 may be the only layer provided. A first side of sensor layer 301 may be configured to receive charged particles, and circuitry may be provided on a second side, opposite from the first side. The circuitry may include an electron counting circuit separately provided for each sensing element.

Figure 4:
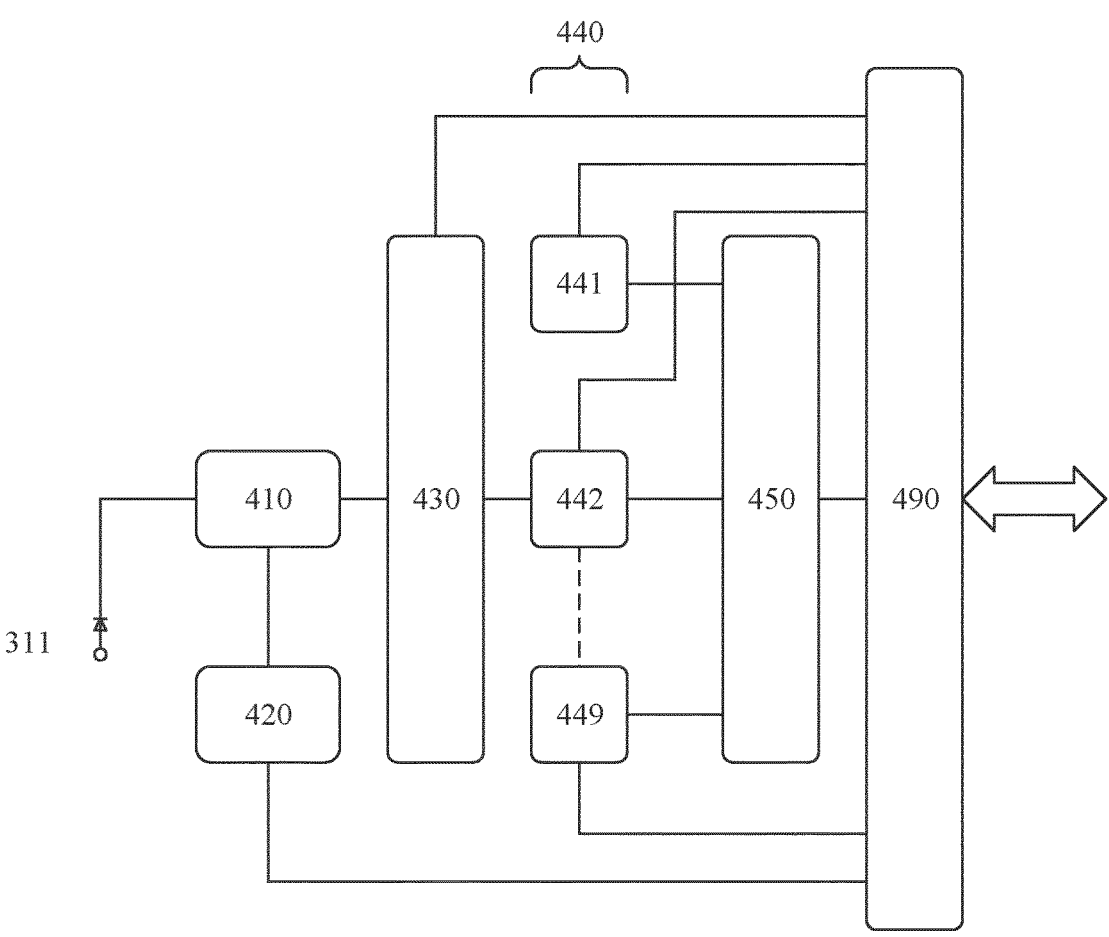
FIG. 4 is a diagrammatic representation of a circuit for charged particle counting, consistent with embodiments of the present disclosure.

Reference is now made to FIG. 4, which illustrates a circuit 400 that may be useful for charged particle counting, consistent with embodiments of the present disclosure. Circuit 400 may be provided at the sensing element level of a detector, such as electron detection device 244 of FIG. 2A, or detector 144 of FIG. 2B. Circuit 400 may be one of a plurality of circuits, each of which is provided for a corresponding sensing element in an array detector. In some embodiments, the detector may include only one sensing element, and only one circuit 400 may be provided. In some embodiments, circuit 400 may be provided in a layer where sensing elements in a detector are formed (e.g., integrated with sensing elements), or in another layer. For example, circuit 400 may be provided in sensor layer 301 of FIG. 3, or may be provided in another layer.

Circuit 400 may be configured to process signals generated from sensing element 311. Sensing element 311 may be configured to generate a response to a charged particle event. A charged particle event may include an electron arrival event. For example, in response to the arrival of an incoming electron at sensing element 311, sensing element 311 may be configured to generate charges or current due to the energy of the incoming electron. The charges or current may be generated within the sensing element and may be fed to circuitry connected to the sensing element. In some embodiments, the circuitry may be integrated with the sensing element.

As shown in FIG. 4, circuit 400 includes an input stage 410, a threshold detector 420, a storage cell multiplexer 430, an array 440 of storage cells, a converter 450, and a control unit 490. Array 440 may include a plurality of storage cells including a first storage cell 441, a second storage cell 442, and so on, up to, for example, an Nth storage cell 449. Storage cells 441 through 449 may include charge storage cells.

Input stage 410 may be configured to have a low input impedance such that all or substantially all charges are extracted from sensing element 311 quickly after they are generated in sensing element 311. Sensing element 311 may be configured to operate with a bias applied such that a depletion region is formed in sensing element 311 that may act as a capture region for incoming charged particles. Incoming charged particles may interact with the material of sensing element 311 and may generate charges through impact ionization. Input stage 410 may be configured such that all charges are pulled out from sensing element 311 as soon as they are generated in sensing element 311 and fed on to other components of circuit 400.

Input stage 410 may include a component configured to impart gain. For example, input stage 410 may include an amplifier. The amplifier may be configured to impart current gain such that current signal from sensing element 311 may be amplified. Furthermore, input stage 410 may be configured to have a conversion function. Input stage 410 may include a component configured to convert electrical signals from one form to another. For example, input stage 410 may include a component configured to convert current signal from sensing element 311 to an electronic signal of another form (e.g., a voltage).

Circuit 400 may include threshold detector 420. Threshold detector 420 may be attached to input stage 410. Threshold detector 420 may be configured to detect signal level of incoming current from sensing element 311 or that of a converted signal. The converted signal may include a signal having a level that is proportional to the incoming current from sensing element 311.

Threshold detector 420 may be configured to determine that a charged particle event occurs. Determinations from threshold detector 420 may be used to control other operations of circuit 400. Threshold detector 420 may be configured so as to detect a start or a stop of a charged particle event. The starting or stopping of a charged particle event may trigger the recording of information from sensing element 311. For example, an integration function may be performed in response to determining that a charged particle event occurs. Integration may refer to a process of obtaining an accumulated value of charge or current over time (e.g., area under a curve).

Threshold detector 420 may be configured to operate with one or more thresholds. For example, threshold detector 420 may be configured to use two values that may be defined and set in threshold detector 420. The two values may include $a_1$ and $a_2$ that may be the same or different from one another. Values of $a_1$ and $a_2$ may be set to be higher than an overall noise level of a detector. The noise level may be a noise floor from sensing element 311, its amplified value, or its converted value. A relationship between $a_1$ and $a_2$ may be, for example, $a_1 \geq a_2$. Thresholds may be set so as to avoid false detection of start or stop points of electron arrival events due to noise.

Circuit 400 may include storage cell multiplexer 430 following input stage 410. In some embodiments, input stage 410 may be optional, for example when a circuit for integration function is provided that has very low input impedance. Hereinafter, the phrase "output of input stage 410" may refer to the output of input stage 410 or the output of an integration circuit that directly follows sensing element 311. The output of input stage 410 may represent output signal from sensing element 311, whether or not it is amplified or converted, for example.

Multiplexer 430 (or "mux") may be configured to connect the output of input stage 410 to a storage cell of array 440. Multiplexer 430 may include a switching element. Multiplexer 430 may include a data selector that is configured to select between several output lines and forward an input signal to the selected output line. Multiplexer 430 may be configured to connect only one output line to the input at a time. For example, multiplexer 430 may be configured to route signals from the output of input stage 410 to only one of storage cell 441, 442, 449 at a time. Furthermore, multiplexer 430 may be configured so that the output of input stage 410 is connected to none of the storage cells of array 440 at a particular time during operation of circuit 400. Similarly, multiplexer 430 may be configured so that output of input stage 410 is connected to other components besides storage cells of array 440. Multiplexer 430 may be controlled by control unit 490.

Array 440 may include one or a plurality of storage cells. The outputs of individual storage cells may be connected to converter 450. Signals that are input to storage cells of array 440 may be converted to another form (e.g., through integration). As an example, current or charge input to storage cells of array 440 may accumulate to form a voltage signal. Converter 450 may be configured to sample the storage cells of array 440. Converter 450 may be configured to process analog signals from the storage cells of array 440. Converter 450 may generate digital signals for data that represent the analog signals.

Converter 450 may include a voltage detector or analog-to-digital converter (ADC), for example Converter 450 may include a comparator having multiple inputs that are connected directly to converter 450. In some embodiments, converter 450 may include a single comparator that is connected to multiple inputs through a multiplexer.

Circuit 400 may be configured to perform interrogation (e.g., an interrogation function) on the storage cells of array 440. Interrogation may refer to the obtaining of information (e.g., transmitting a signal) from a component. In some embodiments, circuit 400 may be configured to detect (e.g., interrogate) only storage cells that are not selected by storage cell multiplexer 430. For example, in some embodiments, interrogation may be performed on storage cells separately from integration so as not to interfere with integration. In some embodiments, however, interrogation may occur simultaneously with integration using the same storage cell.

Converter 450 may include one or more voltage comparators. The voltage comparators may be used to compare voltages from the storage cells of array 440 to reference voltages. The number of voltage comparators and the number of reference voltages may be the same or different. In some embodiments, a voltage buffer may be provided. For example, a voltage buffer may be provided in front of the multiple voltage comparators to reduce the loading effects of input impedances of the voltage comparators on the voltages of the storage cells of array 440. Converter 450 may also include one or a group of ADCs, each with a predefined bit resolution.

Control unit 490 may be configured for bidirectional data flow. Control unit 490 may be configured for various functions. For example, control unit 490 may be configured to: (i) control data to sensing elements (e.g., including timing information), (ii) determine counting results from sensing elements, and (iii) determine a sensing element overflow flag with overflow type data.

Circuit 400 may be configured to count charged particles incident on a detector. If the level of incoming current signal from sensing element 311 crosses a threshold, circuit 400 may be configured to start a counting operation. For example, if threshold detector 420 determines that $a_1$ is exceeded, integration may be performed. Control unit 490 may control storage cell multiplexer 430 to connect the output of input stage 410 to first storage cell 441. A capacitor in first storage cell 441 may be charged as current or charges from sensing element 311 accumulate. At the same time, voltages in one or more of the other storage cells (e.g., second storage cell 442 to Nth storage cell 449) that are not selected by storage cell multiplexer 430 may be detected by converter 450.

Converter 450 may be configured with different reference values that may be used for different purposes, for example as follows. Reference values may be used to confirm the arrival of incoming electrons. Reference values may be used to identify the types of incoming electrons (e.g., to determine whether an incoming electron is a secondary electron or a backscattered electron). Reference values may be used to determine whether there have been more than one electron arriving during an electron arrival event. Reference values may be used to determine whether the sensing element or a storage cell is in an overflow state due to an electron arrival event. Reference values may also be used to determine energy ranges of incoming electrons or the exact energy levels of incoming electrons.

As an example of a use of a reference value, if only one predefined reference voltage or predefined value (e.g., in a case where an ADC is used) is set, the one reference value may be used to identify whether an incoming electron is a secondary electron or a backscattered electron at the time of an electron arrival event of which the result is stored in a storage cell under interrogation. Or, the reference value may be used to confirm that the electron arrival event has occurred (e.g., even after the threshold $a_1$ has been exceeded, thus signifying the start of an electron arrival event, the reference value of converter 450 may be used to confirm that the signal from sensing element 311 corresponds to the detection of a secondary or backscattered electron from a sample, and thus that the electron should be counted).

When multiple reference values are used, a variety of scenarios may be possible. The reference values may be set in accordance with a particular application or purpose. For example, if two predefined reference voltages or predefined values (e.g., in the case where an ADC is used) are set, the following scenarios may be set up. In a first scenario, one of the reference voltages or values may be used to confirm the arrival of the electron during the electron arrival event; and the other reference voltage or value may be used to determine whether one or more than one electron reaches the sensing element during the electron arrival event.

In a second scenario, one of the reference voltages or values may be used to identify the type of incoming electron during the electron arrival event; and the other reference voltage or value may be used to determine whether one or more than one electron reaches the sensing element during the electron arrival event.

In a third scenario, one of the reference voltages or values may be used to determine whether one or more than one electron reaches the sensing element during the electron arrival event; and the other reference voltage or value may be used to determine whether the storage cell is in an overflow state. The overflow state may correspond to a situation where there are more than two electrons reaching the sensing element during the electron arrival event.

It will be understood that more scenarios may be set up by combining different tasks, such as those discussed above. Further predefined voltages or values may be used based on requirements for specific applications. Furthermore, after information interrogation, a storage cell may be reset and information stored in the storage cell may be removed from the storage cell (e.g., the voltage across a capacitor in the storage cell may be reset to a predefined value, such as zero).

There may be a time period associated with an electron arrival event. The expression "during the electron arrival event," for example as discussed above, may refer to a period based on when threshold detector 420 determines that signal from sensing element 311 crosses (e.g., exceeds) $a_1$ and when signal crosses (e.g., falls below) $a_2$. In some embodiments, a predetermined period may be set such that an electron arrival event lasts for a maximum duration from when $a_1$ is exceeded until the end of the predetermined period. If, after a predetermined period, no stop point is detected (e.g., signal crossing the same or another threshold), counting for a given electron arrival event may be forced to stop. If there is no confirmed electron detected during an electron arrival event, a detection error signal may be generated and recorded by control unit 490.

Control unit 490 may be configured for further tasks. For example, when threshold detector 420 determines that a threshold has been crossed, various functions may be performed. When threshold detector 420 detects a start of an electron arrival event, control unit 490 may record the time stamp of the starting point. In some embodiments, only if a start point is detected may control unit 490 monitor whether a subsequent stop point is detected. For example, threshold detector 420 may not use second threshold $a_2$ unless or until first threshold $a_1$ has been crossed. Furthermore, a time stamp may also be recorded for stop points. The threshold associated with the start point may be higher than the threshold associated with the stop point. An event period may be determined based on start and stop points.

A first charged particle event may be detected when threshold detector 420 determines that signal from sensing element 311 exceeds $a_1$. Integration of the first charged particle event may be performed using first storage cell 441. After the first charged particle event, integration of a second charged particle event may be performed using a different storage cell (e.g., second storage cell 442). The term "after" the first charged particle event may refer to the case where signal from sensing element 311 drops below $a_2$. In some embodiments, "after" the first charged particle event may refer to a case where a predetermined period of time passes from when threshold detector 420 has determined that signal from sensing element 311 exceeds $a_1$.

Integration and information interrogation may occur simultaneously. For example, while information interrogation is performed on a cell-by-cell basis, or in parallel with multiple cells that are not selected by storage cell multiplexer 430, circuit 400 may proceed with integration at the cell selected by storage cell multiplexer 430. Integration may cause signals from the output of input stage 410 to be transmitted to the selected storage cell of array 440. Integration may proceed until threshold detector 420 determines that signal from sensing element 311 falls below threshold $a_2$ (or a stop point is otherwise determined). In response to signal level falling below az, storage cell multiplexer 430 may break the connection between input stage 410 (or the output of an integration circuit) and the currently selected storage cell Immediately thereafter, circuit 400 may connect the output of input stage 410 to another storage cell. The storage cell that is then connected may be a storage cell that has already been reset. Integration may then proceed again using the newly selected storage cell. In some embodiments, integration is not started immediately after breaking the connection with the prior storage cell unless, for example, threshold detector 420 determines that $a_1$ is exceeded again.

Integration and interrogation may be ongoing when a detector is in operation. Integration results stored in storage cells may be interrogated and counting results may be sent to control unit 490. Such operations may occur at the sensing element level. Thus, for all sensing elements of a detector, separate integration and interrogation processes may be performed. Data may be processed and sent to an upper level control unit of the detector. For example, controller 109 of FIG. 1 or FIG. 2B may be an upper level control unit that is configured to determine electron counts based on data from lower level control units (e.g., control unit 490 at the sensing element level of a detector).

Control unit 490 may be configured to determine an overflow state (e.g., set an overflow flag) of a sensing element or storage cell. With regard to overflow, there may be several different types. Overflow is discussed in U.S. Publication No. 2019/0378682.

For example, overflow may include a first type of over-flow. The first type of overflow may involve the level of signal relating to one charged particle event exceeding a predetermined value. The predetermined value may be a value determined based on a limit of a circuit associated with a sensing element. For example, the predetermined value may be a percentage of a processing limit of the circuit. The first type of overflow may correspond to cases where multiple charged particles arrive during one charged particle event. For example, multiple charged particles may arrive at a sensing element in close succession. The circuit may be unable to process the output associated with multiple charged particles during one charged particle arrival event discretely. Accordingly, the circuit may record an overflow event by, e.g., setting an overflow flag indicating the first type of overflow.

The first type of overflow may be encountered when a component of a circuit connected to a sensing element is in an overflow state. In some embodiments, the first type of overflow may be encountered when a component of a circuit connected to a sensing element for counting charged particles in a specific energy range is in an overflow state. For example, the first type of overflow flag may be set when an interrogation result shows that the electron arrival event recorded by the storage cell involves more than a certain number of incoming electrons. The certain number may be one or two, for example Whether the certain number is one or two may depend on requirements of particular applications and corresponding reference voltage (or value) setting scenarios. Furthermore, frequency of occurrence of the first type of overflow may be reduced if the dynamic range of the circuit is increased (e.g., the input stage, the storage multiplexer, the storage cell, and the convertor can operate under higher signal swing). Additionally, the first type of overflow may be reduced by increasing the capacitance of the storage cells or reducing the signal swing of the input stage. In some embodiments, this may be at the expense of energy resolution loss.

Overflow may also include a second type of overflow. The second type of overflow may involve situations where during the signal detection and processing of one charged particle event, another charged particle event occurs. The second type of overflow may be encountered when one charged particle arrives at a sensing element and a subsequent charged particle arrives in a state where the sensing element and its associated circuitry are unable to give a proper response to the subsequent charged particle arrival event. This may be due to processing of the first charged particle arrival event by a circuit (e.g., circuit 400) being ongoing when the subsequent charged particle arrives.

The second type of overflow may be indicated by a flag. The second type of overflow flag may be set when there is no available storage cell for storage cell multiplexer 430 to select. In some embodiments, the second type of overflow may be avoidable if a large enough number of storage cells are provided. This may be based on the variety of reference voltages or values used in converter 450 and the operation speed of components in converter 450. The rate of the second type of overflow may be reduced with further enhancements in the speed of sensing element 311, input stage 410, threshold detector 420, storage cell multiplexer 430, and converter 450.

Using an overflow indication may be helpful to reduce or avoid miscounting or erroneous detection of charged particle events. Some embodiments may be configured to reduce miscount rate at the expense of some details of events marked with overflow being missed (e.g., information loss). For example, marking an event with the second type over-flow may result in missing some details such as specific energy of each charged particle that arrives after a first charged particle during a charged particle event, but may nevertheless provide useful information indicating that more than just one charged particle has arrived during the charged particle event. Without the use of an overflow flag, any information of subsequent charged particle events may be overlooked.

Some embodiments of the disclosure may use an analog pipeline in a detection circuit and may provide converters in a signal processing portion of the circuit to ensure that the overall processing rate of the detection circuit is higher than the average rate at which a sensing element generates signals in response to charged particle arrival event. Some embodiments may reduce or avoid the second type of overflow. To make further improvements, a detector or charged particle beam apparatus may be configured so that the occurrence of the first type of overflow is reduced. The occurrence of the first type of overflow may be based on the speed of sensing elements generating signals in response to charged particle arrival events and the bandwidth of an analog front-end of the detection circuit. If probe current is increased beyond a certain level, the detection circuit may encounter the first type of overflow indicating the occurrence of an event with information loss. This may be due to the front-end of the detection circuit being unable to distinguish multiple charged particle arrival events. For example, multiple charged particles may arrive at a sensing element in close succession or at substantially the same time. To reduce the first type of overflow, the speed of sensing elements and bandwidth of front-ends may be increased. Alternatively or additionally, the detector may be configured such that the intensity distribution of charged particles arriving on the detection surface is made more uniform and evenly spread over a larger area, thus covering more sensing elements.

In a comparative embodiment, an electron counting circuit may have a signal path after a sensing element or a detector start from an analog front-end that may include a transimpedance amplifier (TIA). The analog front-end is then followed by a threshold detector, a window detector, or a data converter (e.g., ADC). In such a configuration, the energy of the signal representing an incoming electron event may not be well collected if the combination of detector and TIA has an analog bandwidth insufficient to allow all the frequency components of the signal from the detector to be transmitted. This may reduce the accuracy of energy detection or discrimination of the incoming electron, and may also cause SNR deterioration.

In some embodiments of the disclosure, a segmented detector may be combined with sensing element level signal processing circuitry. Some embodiments may achieve the following:

1. Each sensing element in the segmented detector has a small area and may have relatively small parasitic capacitance as compared to, for example, a single large-area sensing element. This may allow an analog signal path connected to each sensing element to achieve wide bandwidth. Analog bandwidth of the analog signal path may be made high enough that all or substantially all frequency components of the signal of the electron arrival event are transmitted through the analog signal path.

2. Downstream from an analog signal path, signals may be feed to an integrator (e.g., integration circuit). Results from the integrator may be a voltage with an amplitude proportional to energy of the incoming electron. Such a configuration may improve accuracy of electron energy discrimination. Some comparative designs may use a circuit based on peak detection to determine the energy level of incoming electrons. Comparative methods may have poor energy discrimination accuracy. This may be due to the peak level of a signal not always being in proportion to the energy level of the incoming electrons. The shape of the signal waveform may also affect the peak level of the signal. By using an integrator to integrate signals, influence of signal waveform variation may be reduced or removed.

3. Frequency component loss of the detection signal may be reduced or eliminated, and overall SNR during the electron counting process may be improved. Such SNR improvement may help to improve electron counting accuracy and energy discrimination accuracy.

In addition, in some embodiments, an analog pipeline configuration may be provided for an integration circuit and converter (e.g., a level detection circuit, or a circuit that includes an ADC), and wide dynamic range of electron beam detection may be achieved. Detection signals may be continuously pumped out from sensing elements to their associated signal processing circuits. Each stage of a signal processing circuit (e.g., converter 450 that may include a voltage detection circuit or ADC) may have an upper limit of processing speed. If the period between two electron arrival events is less than the period for the converter to perform signal processing, miscounting may result. With an analog pipeline in the integration circuit, the miscounting rate may be reduced as the time period between two electron arrival events may vary due to the stochastic behavior of electrons. Further level detection circuits or ADCs may be provided at each sensing element level circuit and more level detection circuits or ADCs may operate in parallel.

Comparative electron counting system may normally be designed for application cases with extremely low probe current. In such cases, there may be long time periods between any two electron arrival events. If probe current is increased, then the time period between two electron arrival events becomes shorter. Comparative designs may be unable to recognize separate electron arrival events occurring in close succession and may cause high miscounting rate under such conditions. Some embodiments of the disclosure, however, may enable accurate charged particle counting even when the time period between two electron arrival events in one sensing element is shortened (e.g., close to zero). Approaches that attempt to increase the speed of a converter (e.g., a voltage detector or ADC) and analog bandwidth of the signal path may be unable to achieve accurate charged particle counting with a miscount rate below an acceptable level. In some embodiments of the disclosure, a high-speed level detection circuit may be combined with signal paths having wide analog bandwidth and a high-speed analog signal processing pipeline. In some embodiments, miscounting rate may be greatly reduced relative to comparative embodiments.

Figure 5A:
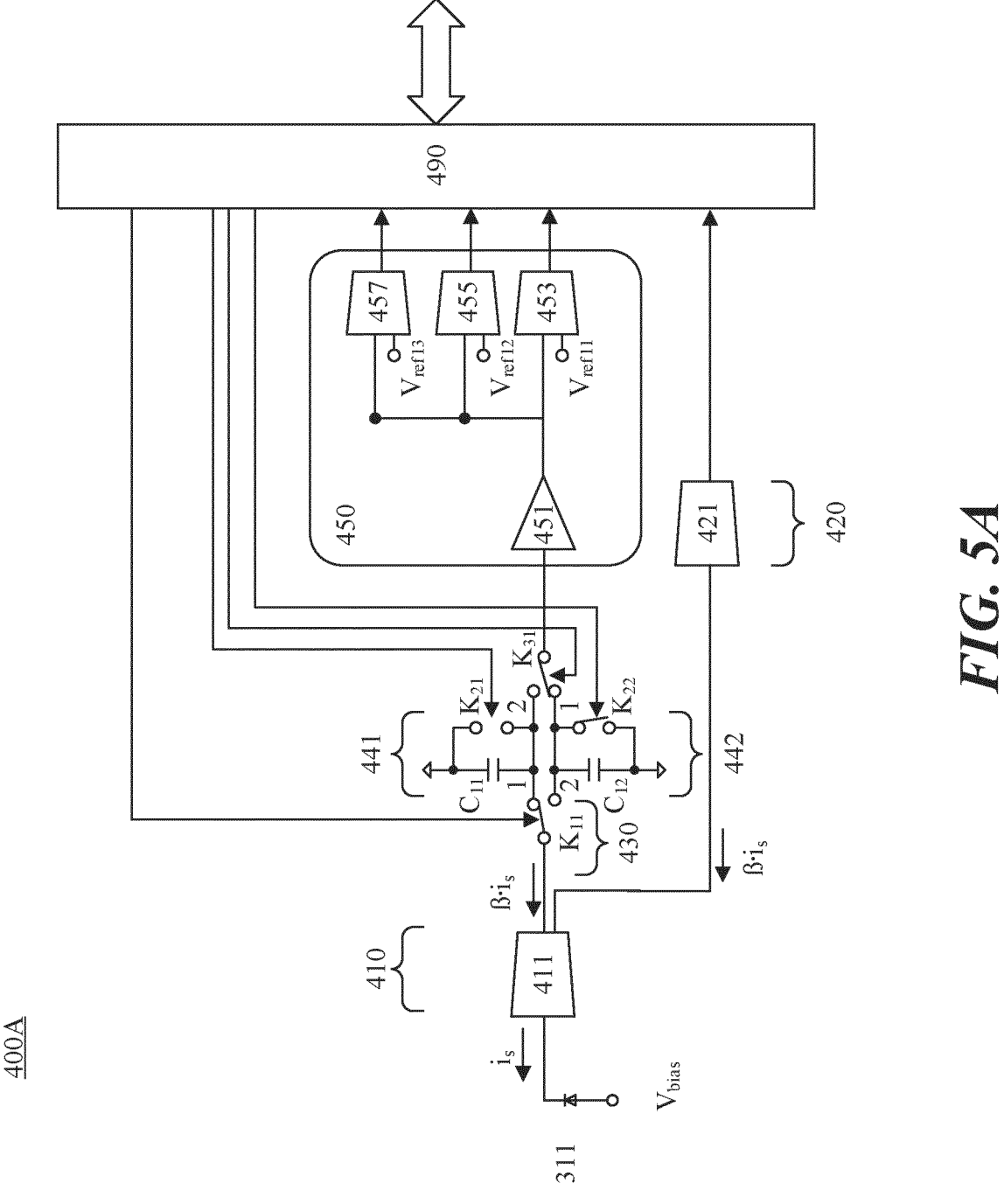
FIGS. 5A-5C illustrate exemplary implementations of a circuit for charged particle counting, consistent with embodiments of the present disclosure.

Reference will now be made to FIG. 5A, which shows a diagrammatic representation of an implementation of a circuit 400A that may be useful for electron counting, consistent with embodiments of the disclosure Similar to circuit 400 of FIG. 4, circuit 400A may include sensing element 311, input stage 410, threshold detector 420, storage cell multiplexer 430, first storage cell 441 and second storage cell 442, converter 450, and control unit 490. As examples of such elements, there may be provided a current controlled current source (CCCS) 411 that may have a current gain of $\beta$, a current detector 421, switch $K_{11}$, capacitors $C_{11}$ and $C_{12}$, voltage buffer 451, and voltage comparators 453, 455, and 457. Sensing element 311 may be operated with a bias voltage $v_{bias}$. Sensing element 311 may be configured to output a current signal to CCCS 411. CCCS 411 may be configured to amplify charge or current received from sensing element 311 and output an amplified signal $\beta i_s$.

CCCS 411 may have a plurality of outputs, for example, one going to threshold detector 420 and one to be used as output of input stage 410. Each of the outputs of CCCS 411 may output an identical signal (e.g., amplified signal $\beta i_s$).

Circuit 400A may be configured to perform operations using determinations based on amplified signal $\beta i_s$. For example, electron counting start and stop decisions may be made by current detector 421. Current detector 421 may compare $\beta i_s$ to thresholds $a_1$ and $a_2$ and may make determinations when the thresholds are passed. For example, current detector 421 may determine that an electron arrival event begins when $\beta i_s$ exceeds $a_1$, and the electron arrival event ends when $\beta i_s$ falls below $a_2$. Current detector 421 may determine an integration start signal when $\beta i_s$ exceeds $a_1$, and an integration stop signal when $\beta i_s$ falls below $a_2$.

Storage cell multiplexer 430 may be formed by switch $K_{11}$. Circuit 400A may include an array of two storage cells. Multiplexer 430 may be configured to send amplified signal $\beta i_s$ to any of the storage cells. Storage cells may be formed by a storage capacitor and a corresponding reset switch connected in parallel with the storage capacitor. For example, first storage cell 441 may be formed by capacitor $C_{11}$ and switch $K_{21}$. Second storage cell 442 may be formed by capacitor $C_{12}$ and switch $K_{22}$. It will be understood that further storage cells may be added, and switch $K_{11}$ may be switchable between more than two states. Furthermore, a single storage cell may also be provided. In some embodiments, a single storage cell may be provided with switch $K_{11}$ being switchable between a first state connecting the output of input stage 410 to the storage cell and a second state connecting the output of input stage 410 to ground. While integration results are being processed, switch $K_{11}$ may be in the second state. If signal processing of a first electron arrival event is ongoing while a second electron arrival event occurs, the circuit may be configured such that the second electron arrival event does not disturb the signal processing of the first electron arrival event. In such a case, when the second electron arrival event occurs, overflow (e.g., the second type of overflow) may be recorded.

Converter 450 may have only one input channel and may include voltage buffer 451. Voltage buffer 451 may be used to reduce the load on storage cells, and may enhance performance in cases where multiple voltage comparators are used in one converter simultaneously. A switch $K_{31}$ may be provided to allow converter 450 to access all storage cells of the storage cell array. A multiplexer that may include switch $K_{31}$ may be provided between the storage cell array and converter 450. Converter 450 may be formed as a voltage detector that uses voltage buffer 451 and a plurality of voltage comparators 453, 455, and 457. A plurality of reference voltages with different values may be used. Based on differences between values of input voltage and the values of the reference voltages, voltage comparators 453, 455, and 457 may react to the input voltage and generate output signals. The output signals from voltage comparators 453, 455, and 457 may be used as information about the corresponding charged particle arrival event.

Switches $K_{11}$ and $K_{31}$ may be configured such that only one storage cell is selected while integration is performed. As shown in FIG. 5A, switch $K_{11}$ may be connected to position 1 to perform integration using first storage cell 441. In some embodiments, switches $K_{11}$ and $K_{31}$ may be configured so as to never select the same storage cell while integration is performed. For example, switch $K_{11}$ may be connected to position 1 while switch $K_{31}$ may be connected to position 1. Integration may be performed using a storage cell while interrogation is performed on another storage cell.

Furthermore, switches $K_{11}$ and $K_{31}$ may also be switchable to a disconnected position where none of the storage cells of array 440 is selected.

In some embodiments, switches $K_{11}$ and $K_{31}$ may be configured such that the same storage cell may be selected at a certain time. For example, the circuit may be configured such that switches $K_{11}$ and $K_{31}$ may operate with an overlap period where the same storage cell is selected. During the processing period of a specific integration result, depending on the overlap period, settings of reference voltages may be adjusted, for example, to compensate for effects introduced by selecting the same storage cell. Furthermore, in some embodiments, voltage buffer 451 may be positioned between storage cells and switch $K_{31}$. Multiple voltage buffers may be provided.

Integration may be performed by changing the state of the reset switch of a storage cell from closed to open. For example, integration using first storage cell 441 may begin when switch $K_{21}$ is communicatively disconnected. The reset switch of each storage cell may be kept closed from the time that the storage cell is reset until the time that the storage cell is used for integration. Control unit 490 may initiate integration by actuating a switch (e.g., switch $K_{21}$ or switch $K_{22}$), along with actuating switch $K_{11}$ to select a storage cell. Determining whether to start or stop integration may be based on a determination by threshold detector 420 (e.g., by determining an integration start or stop signal). For example, threshold detector 420 may transmit an integration start signal to control unit 490, and control unit 490 may actuate switches such as switch $K_{21}$ or switch $K_{22}$.

Interrogation may be started by connecting a storage cell to converter 450. When converter 450 is connected to a storage cell, signals input to converter 450 may be processed. Signal processing occurring in converter 450 may take a certain amount of time. For example, voltage buffer 451 may output signals to multiple voltage comparators. Multiple determinations may be made based on comparisons between input voltage and reference voltages. Based on such determinations, it may be determined to count an electron, or determine other information. For example, it may be determined that two electrons arrived at sensing element 311 during an electron arrival event and thus the count should be incremented by two. Furthermore, it may be determined that one of the electrons was a secondary electron and one was a backscattered electron, for example.

While such processing is ongoing, however, further electrons may arrive at sensing element 311. In order to not miss such further electron arrival events, circuit 400A may cause integration to be performed using a different storage cell when a new electron arrival event is detected. This integration may be performed while interrogation or signal processing of the prior electron arrival event is still ongoing. For example, threshold detector 420 may detect a first electron arrival event beginning when threshold $a_1$ is exceeded, and control unit 490 may start integration using a first storage cell. Threshold detector 420 may also detect that the first electron arrival event has ended when signal input to threshold detector 420 falls below threshold $a_2$. Next, threshold detector 420 may detect a second electron arrival event when threshold $a_1$ is exceeded again. However, at this time, interrogation or signal processing of the first electron arrival event, which may be based on a determination of charge collected in the first storage cell, may not yet have finished. Regardless, circuit 400A may accommodate the second electron arrival event and record it using a second storage cell. Multiplexer 430 may connect the output of input stage 410 to the second storage cell, and thus, information of the second electron arrival event may be adequately recorded. In this way, information of subsequent electron arrival events may be recorded even when signal processing relating to previous electron arrival events is still ongoing. Circuit 400A may allow substantially continuous capture of information from sensing element 311 while operations such as signal processing and electron counting determinations may occur asynchronously. In some embodiments, as soon as integration using one storage cell is finished, multiplexer 430 may connect the output of input stage 410 to the next available storage cell that may have already been reset. Detection signals may be continuously pumped out from sensing elements and routed to signal processing circuitry.

In some embodiments, determining whether a new electron arrival event occurs may be based on a threshold different from that used to detect the first electron arrival event. The threshold may be set to a level based on a pile-up effect due to the new electron arrival event. For example, threshold detector 420 may detect a first electron arrival event beginning when threshold $a_1$ is exceeded. The detected signal level (e.g., voltage, current, etc.) may begin to drop. But the signal level may not drop below threshold $a_2$ that may be used to represent the end of an electron arrival event in another embodiment. However, the signal level variation may reach a level that passes a threshold $a_3$, stop dropping, and may rise again. Passing threshold $a_3$ may indicate the ending of the first electron arrival event. Rising of the signal level after passing threshold $a_3$ may indicate that a second electron arrival event starts. The second electron arrival event may partially overlap with the first electron arrival event in time. The level of threshold $a_3$ may be based on behavior of electron arrival events occurring in close succession. A relationship of thresholds may be, for example, $a_1 \geq a_3 \geq a_2$. Determination of whether a new electron arrival event occurs may be based on signal levels and time-dependent behavior.

Figure 5B:
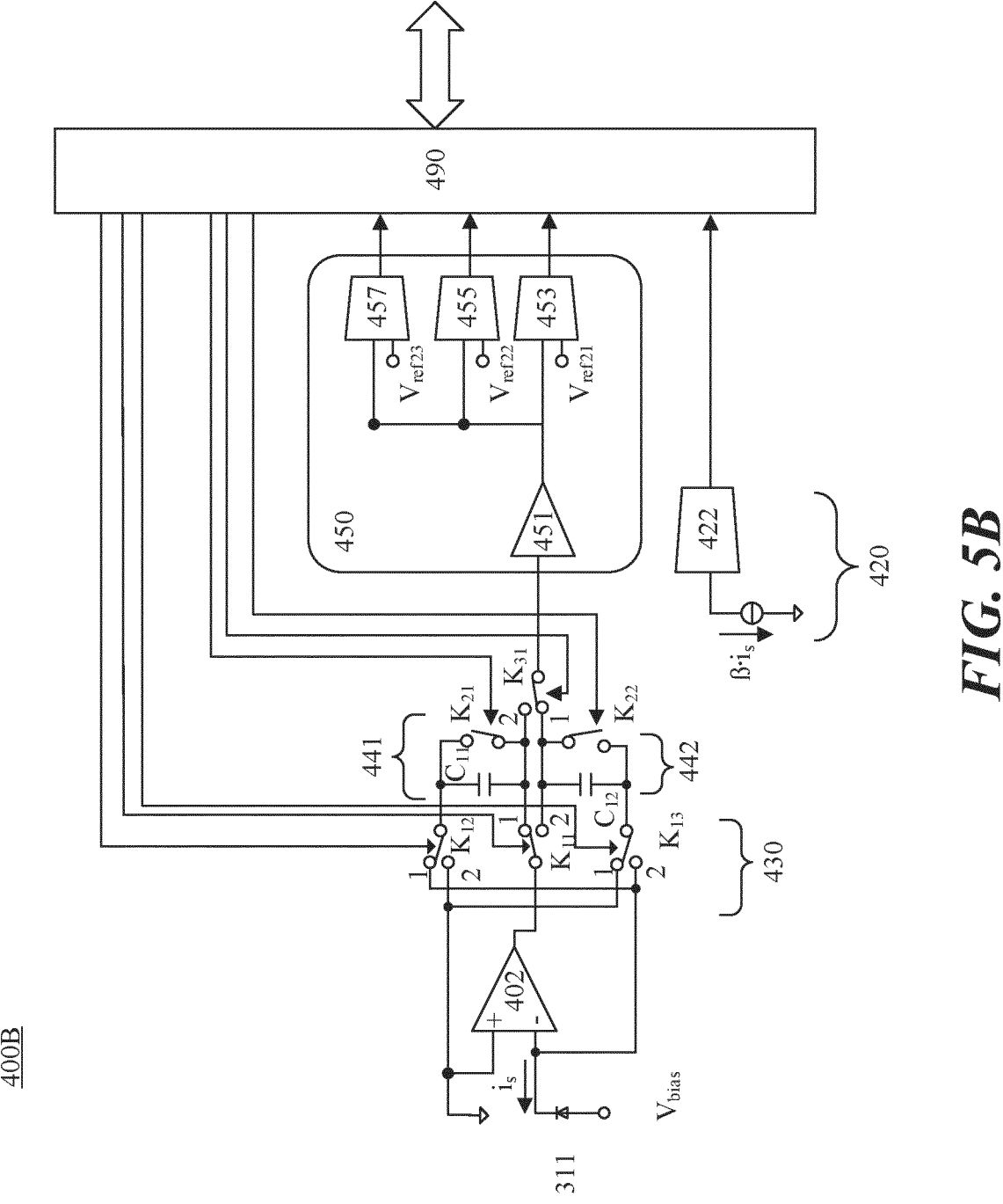

Reference is now made to FIG. 5B, which shows a diagrammatic representation of an implementation of a circuit 400B that may be useful for electron counting, consistent with embodiments of the disclosure. Circuit 400B may be a variation of circuit 400 of FIG. 4, and similar to circuit 400A of FIG. 5A, circuit 400B may include examples of various general components. Circuit 400B of FIG. 5B includes a wideband operation amplifier (OPA) 402 connected to sensing element 311. Different from previous examples, no input stage is used. OPA 402 may be used to achieve an integration function in conjunction with storage capacitors $C_{11}$ and $C_{12}$. An output of OPA 402 may be analogous to the output of input stage 410 discussed in the previous examples. Signals from sensing element 311 may be transmitted to storage cells without passing through an input stage.

As shown in FIG. 5B, circuit 400B may include a switch $K_{12}$ and a switch $K_{13}$. Multiplexer 430 may comprise switches $K_{11}$, Ku, and $K_{13}$. By adding switch $K_{12}$ and switch $K_{13}$, isolation may be improved between OPA 402 and storage cells that are not used for integration. Furthermore, compensation for OPA 402 used in the integration circuit may be easily implemented. Additionally, adding switch $K_{12}$ and switch $K_{13}$ may reduce interference between the integration circuit and converter 450. Energy measurement accuracy may be improved.

Circuit 400B may be configured to perform operations using determinations based on amplified signal $\beta i_s$. Amplified signal $\beta i_s$ may be sampled or mirrored from OPA 402. Electron counting start and stop decisions may be made by a current detector 422. Current detector 422 may compare $\beta i_s$ to thresholds $a_1$ and $a_2$ and determine, for example, that an electron arrival event begins when $\beta i_s$ exceeds $a_1$, and the electron arrival event ends when $\beta i_s$ falls below $a_2$.

Circuit 400B may be configured to perform operations similar to that of circuit 400A. For example, circuit 400B may be configured to count charged particles by performing integration using storage cells and, using converter 450, perform interrogation on storage cells. Integration may be done by changing the state of a reset switch of a storage cell from closed to opened. After processing information from storage cells, e.g., by using converter 450, storage cells may be reset by actuating the reset switch.

Figure 5C:
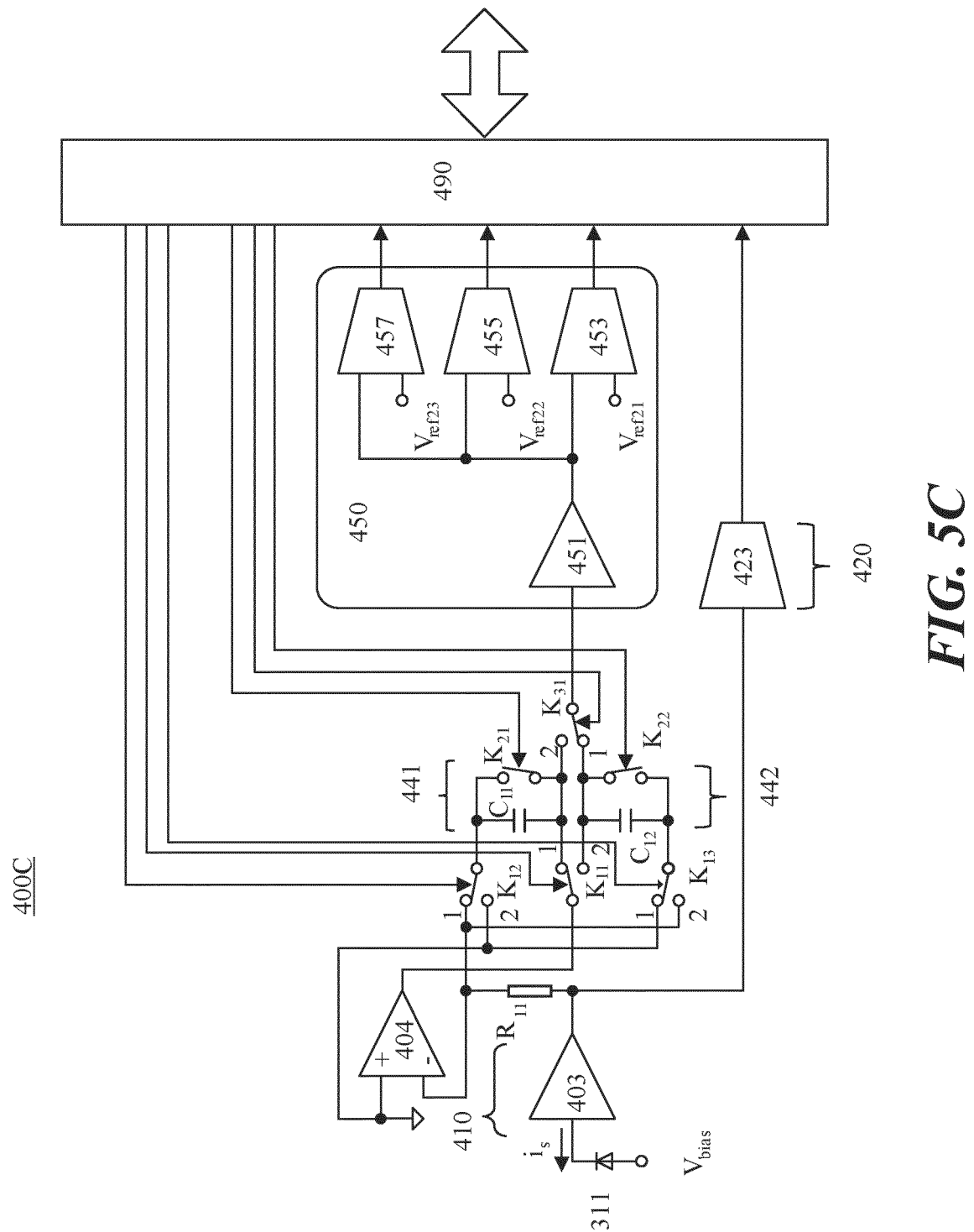

Reference is now made to FIG. 5C, which shows a diagrammatic representation of an implementation of a circuit 400C that may be useful for electron counting, consistent with embodiments of the disclosure. Circuit 400C may be a variation of circuit 400 of FIG. 4, and similar to circuit 400A of FIG. 5A and circuit 400B of FIG. 5B, circuit 400C may include examples of various general components. Circuit 400C of FIG. 5C includes a wideband transimpedance amplifier (TIA) 403 connected to sensing element 311. Input stage 410 may be formed by an amplifier such as TIA 403. TIA 403 may comprise an OPA. The output of input stage 410 may be a voltage signal.

Circuit 400C may include a plurality of amplifiers. A first amplifier may be formed by TIA 403. A second amplifier may be formed by an OPA 404. OPA 404 may be used to achieve an integration function in conjunction with storage capacitors $C_{11}$ and $C_{12}$.

Circuit 400C may include a resistor $R_{11}$. The output of input stage 410 may be a voltage signal, and resistor $R_{11}$ may be configured to convert the output of input stage 410 to a current signal with signal level in proportion to the output of input stage 410. OPA 404 be an amplifying device configured to be used with external feedback components (e.g., resistors and capacitors) between its output and input terminals. OPA 404 may receive a current signal from resistor $R_{11}$ and may be used to perform integration using storage cells (e.g., first storage cell 441 and second storage cell 442). Signals from sensing element 311 may be transformed and converted to various forms as they are transmitted to storage cells.

Circuit 400C may be configured to perform operations using determinations based on a converted signal from sensing element 311. For example, input stage 410 may convert a current or charge signal from sensing element 311 to a voltage signal and may feed the voltage signal to threshold detector 420. Threshold detector 420 may include voltage comparator 423. Voltage comparator 423 may compare the voltage signal input into threshold detector 420 to a threshold. Multiple thresholds may be used, such as $a_1$ and $a_2$. The thresholds may include reference voltages. Electron counting start and stop decisions may be made by voltage comparator 423. For example, voltage comparator 423 may determine that an electron arrival event begins when $a_1$ is exceeded. In some embodiments, to account for hysteresis effects, multiple voltage comparisons may be used to improve performance and reduce the rate of false counting.

Circuit 400C may be configured to perform operations similar to that of circuit 400A or circuit 400B. For example, circuit 400C may be configured to count charged particles by performing integration using storage cells and, using converter 450, perform interrogation on storage cells. Integration may be done by changing the state of a reset switch of a storage cell from closed to opened. After processing information from storage cells, e.g., by using converter 450, storage cells may be reset by actuating the reset switch.

Figure 6:
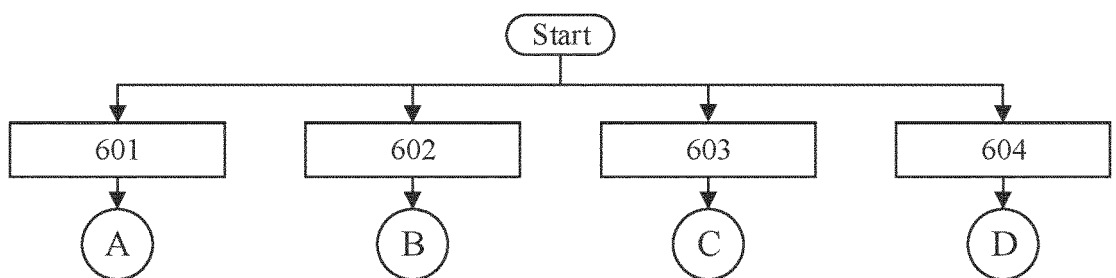
FIG. 6 is a flow chart of a charged particle detection method, consistent with embodiments of the present disclosure.

Reference is now made to FIG. 6, which is a flowchart illustrating a method 600 that may be useful for electron counting, consistent with embodiments of the disclosure. Method 600 may be performed by a controller of the charged-particle inspection system (e.g., controller 109 in FIG. 1 or FIG. 2B, or control unit 490 of FIG. 4 and FIGS. 5A-5C, or combinations thereof). The controller may include circuitry (e.g., a memory and a processor) programmed to implement method 600. For example, the controller may be an internal controller or an external controller coupled with the charged-particle inspection system. A circuit that may be used for charged particle counting, e.g., circuit 400 of FIG. 4 may be operated in accordance with method 600. Processing consistent with method 600 may be performed on a sensing element by sensing element basis.

As shown in FIG. 6, method 600 may begin at a "start" step. At the start step, a charged particle beam may be generated. A beam by electron beam tool 100. Generation of a primary charged particle beam may cause secondary beams to be formed that are directed to a detector of a charged particle beam apparatus. Detection may be started as charged particles begin impinging on the detector. The detector may include a sensing element (e.g., sensing element 311).

Method 600 may include performing a plurality of processes in parallel. Each process may be a background operation that may be ongoing while a detector is being operated. For example, as shown in FIG. 6, method 600 may include steps 601, 602, 603, and 604. Step 601 may include performing sensing element signal level detection. Step 602 may include performing integration. Step 603 may include performing signal processing. Step S604 may include performing overflow monitoring. Other steps may also be performed in parallel.

Figure 7A:
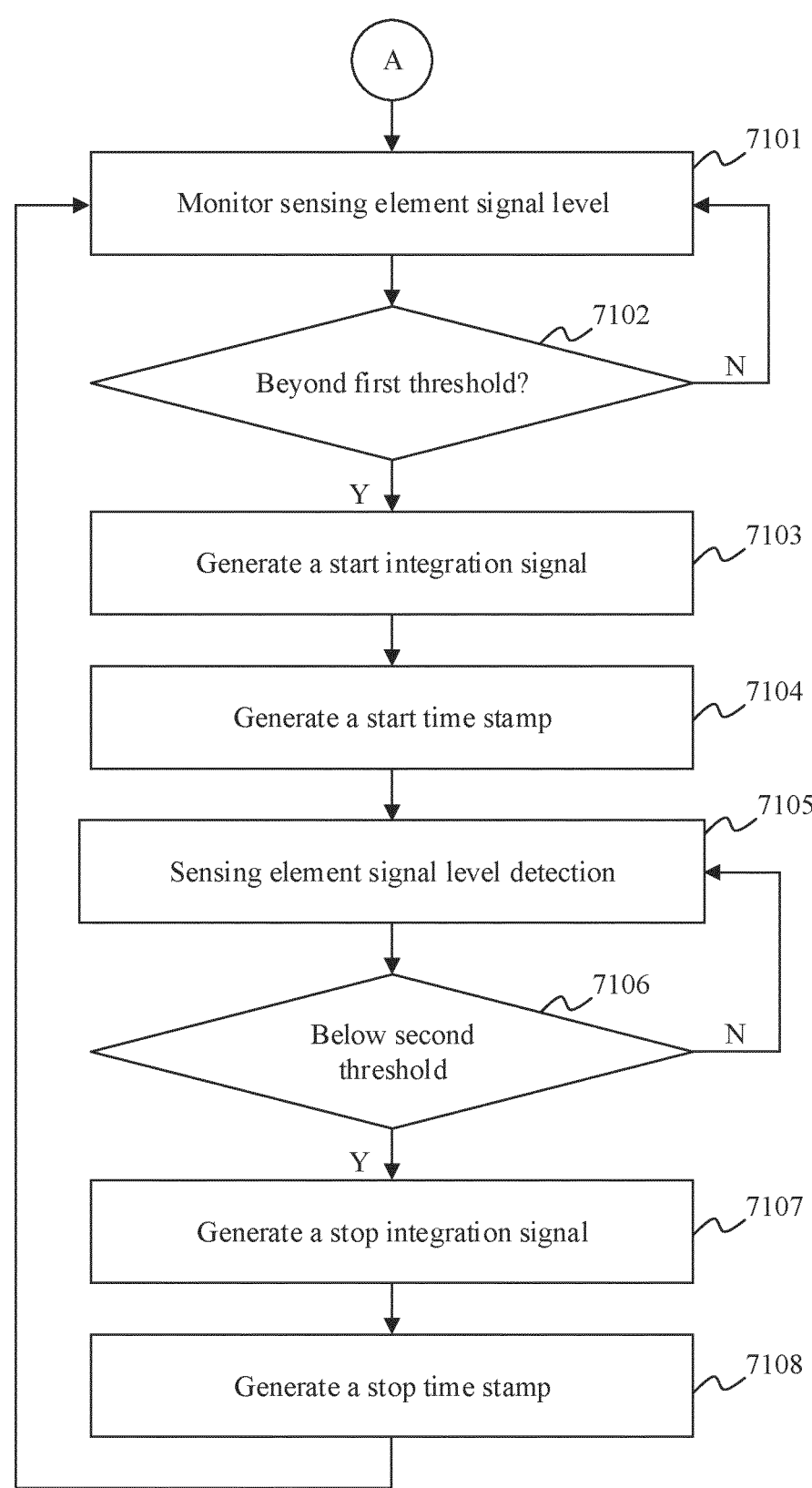
FIGS. 7A-7D are flow charts of a charged particle detection method, consistent with embodiments of the present disclosure.

As shown in FIG. 7A, certain processing may follow step 601. Continuing from "A", method 600 may include a step 7101 of monitoring sensing element signal level. Step 7101 may include receiving a signal coming from sensing element 311, or a signal representing its output (e.g., an amplified signal). The magnitude of the signal may be measured. In step 7102, it may be determined whether a first threshold has been crossed. Step 7102 may include determining, using threshold detector 420, whether the output of input stage 410 crosses (e.g., exceeds) threshold $a_1$.

If it is determined in step 7102 that the first threshold has not been exceeded, it may be determined that any signal coming from sensing element 311 is noise. The method may return to step 7101 and continue to monitor sensing element signal level.

If it is determined in step 7102 that the first threshold has been exceeded, it may be determined that an electron arrival event has begun. In response to the first threshold being exceeded in step 7102, the method may proceed to step 7103 and an integration start signal may be generated. The integration start signal may be generated and transmitted from threshold detector 420. In some embodiments, control unit 490 may generate the integration start signal. For example, control unit 490 may generate the integration start signal based on output from threshold detector 420. Additionally, step 7104 may be performed and a time stamp may be generated. The time stamp may be associated with the integration start signal.

As shown in FIG. 7A, step 7105 may be performed of sensing element signal level detection. Signal level of a signal from sensing element 311 may be continued to be monitored. At step 7106, it may be determined whether a second threshold has been crossed. Step 7106 may include determining, using threshold detector 420, whether the output of input stage 410 crosses (e.g., falls below) threshold $a_2$.

If it is determined in step 7106 that signal level has not fallen below the second threshold, it may be determined that the electron arrival event is still ongoing. The method may return to step 7105 and continue to monitor sensing element signal level.

If it is determined in step 7106 that signal level has fallen below the second threshold, it may be determined that the electron arrival event has ended. In response to the second threshold being passed in step 7106, the method may proceed to step 7107 and an integration stop signal may be generated. Additionally, step 7108 may be performed and a time stamp may be generated. The time stamp may be associated with the integration stop signal. After step 7108, the method may return to step 7101 and repeat.

Figure 7B:
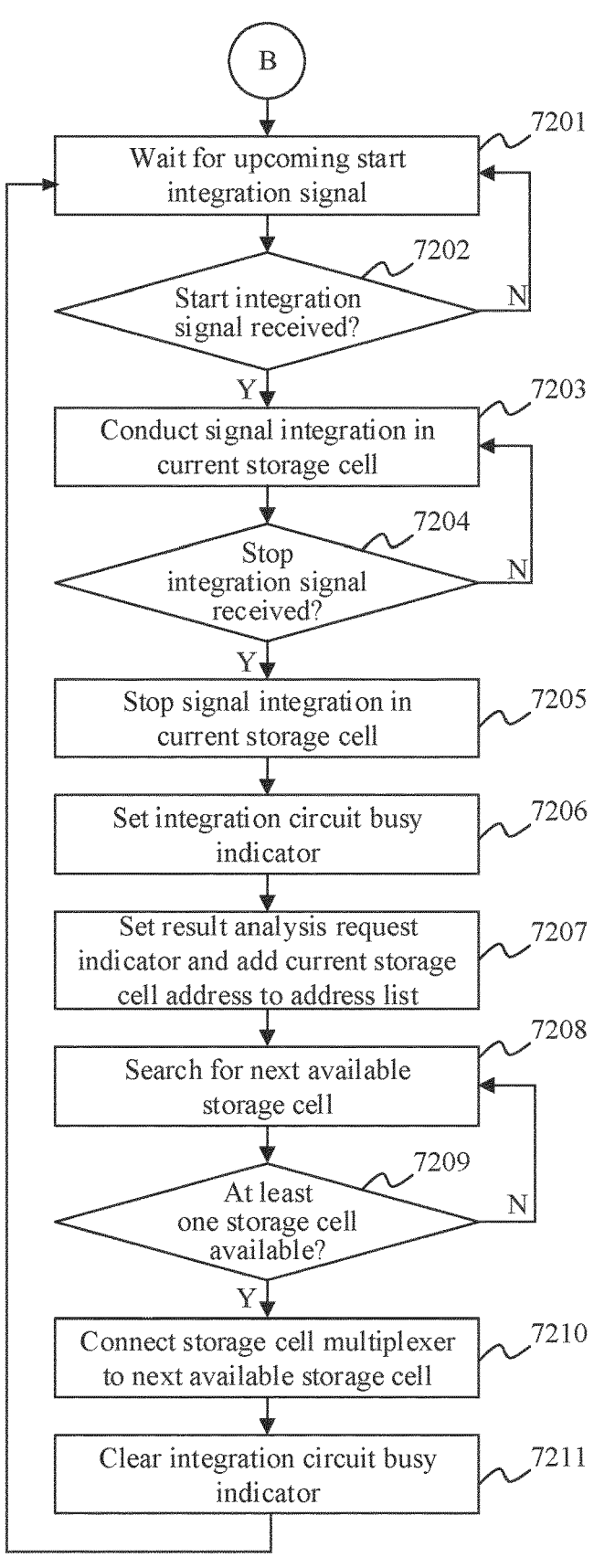

As shown in FIG. 7B, certain processing may follow step 602. Continuing from "B", method 600 may include a step 7201 of monitoring for an integration start signal. Step 7201 may include receiving a signal from control unit 490. Step 7202 may include determining, using control unit 490 or another controller, whether an integration start signal has been generated or received. The integration start signal may be that generated in step 7103 of FIG. 7A.

As shown in FIG. 7B, if it is determined in step 7202 that, for example, an integration start signal has not been received, the method may return to step 7201 and continue to monitor for an integration start signal.

If it is determined in step 7202 that an integration start signal has been received, the method may proceed to step 7203 and integration may be performed. Step 7203 may include conducting signal integration using the currently selected storage cell. For example, storage cell multiplexer 430 may select a storage cell of array 440 (see FIG. 4). At the outset of method 600, storage cells may be in a reset state. A corresponding reset switch of a selected storage cell may be closed.

In step 7203, integration may be performed, where integration may involve accumulation of charge or current over time (e.g., area under a curve) using signals from sensing element 311. Step 7203 may include actuating a reset switch. For example, when integration using first storage cell 441 (see FIG. 5A) is begun, switch $K_{21}$ may be set to an open state. During integration, sensing element 311 may output charge or current that may be amplified and is transmitted to first storage cell 441 where the charge or current accumulates in capacitor $C_{11}$.

In step 7204, it may be determined whether an integration stop signal has been received. If it is determined in step 7204 that an integration stop signal has not been received, the method may return to step 7203 and integration may continue.

If it is determined in step 7204 that an integration stop signal has been received, signal integration corresponding to the electron arrival event may discontinue. The method may proceed to step 7205. In step 7205, signal integration in the currently selected storage cell may be stopped. The current storage cell may be that selected by multiplexer 430. Additionally, step 7206 may be performed. In step 7206, an integration circuit busy indicator may be set. The integration circuit busy indicator may be related to an overflow state.

In step 7207, a result analysis request indicator may be set, and an address of the currently selected storage cell may be added to an address list. Setting of the result analysis indicator may be based on criteria. For example, upon integration being performed using a storage cell, it may be determined that analysis should be performed on that storage cell when integration completes. The criteria may include whether successive integration start and stop signals are received. It may be automatically determined to set a result analysis request indicator in response to receiving an integration stop signal after an integration start signal. In some embodiments, the criteria may include whether an operator has requested imaging results. In some embodiments, the criteria may include whether an operator has requested detailed results, such as results indicating electron energy. The address of a storage cell may refer to information that may be used to identify the storage cell. Result analysis may correspond to signal processing related to counting or determining energy associated with an electron arrival event, for example. The address list may be a list that is used to store addresses of storage cells that include data to be analyzed. Storage cells may be interrogated based on whether or not they are on the address list.

In step 7208, a next available storage cell may be searched for. For example, when array 440 includes a plurality of storage cells, and a currently selected storage cell has just been used for integration, it may be determined whether another storage cell of array 440 is available. Step 7208 may include incrementing a storage cell selector. Storage cells may be incremented one-by-one.

In step 7209, it may be determined whether at least one storage cell is available. If no further storage cell is available, the method may return to step 7208 and wait for a next available storage cell. If a storage cell is determined to be available, the method may proceed to step 7210. At step 7210, a storage cell multiplexer may select the next available storage cell. Step 7210 may include actuating a switch to connect the output of input stage 410 to a storage cell (e.g., the next one of storage cells 441, 442, . . . 449). For example, assuming storage cell 441 (see FIG. 4) was just used for integration, multiplexer 430 may connect the output of input stage 410 to storage cell 442. Additionally, at step 7211, the integration circuit busy indicator may be cleared. The integration circuit busy indicator may be cleared upon establishing the connection between the next available storage cell and the output of input stage 410. Thus, the integration circuit busy indicator may be set at step 7206 and may be maintained in the set state until step 7211. After step 7211, the method may return to step 7201 and repeat.

Figure 7C:
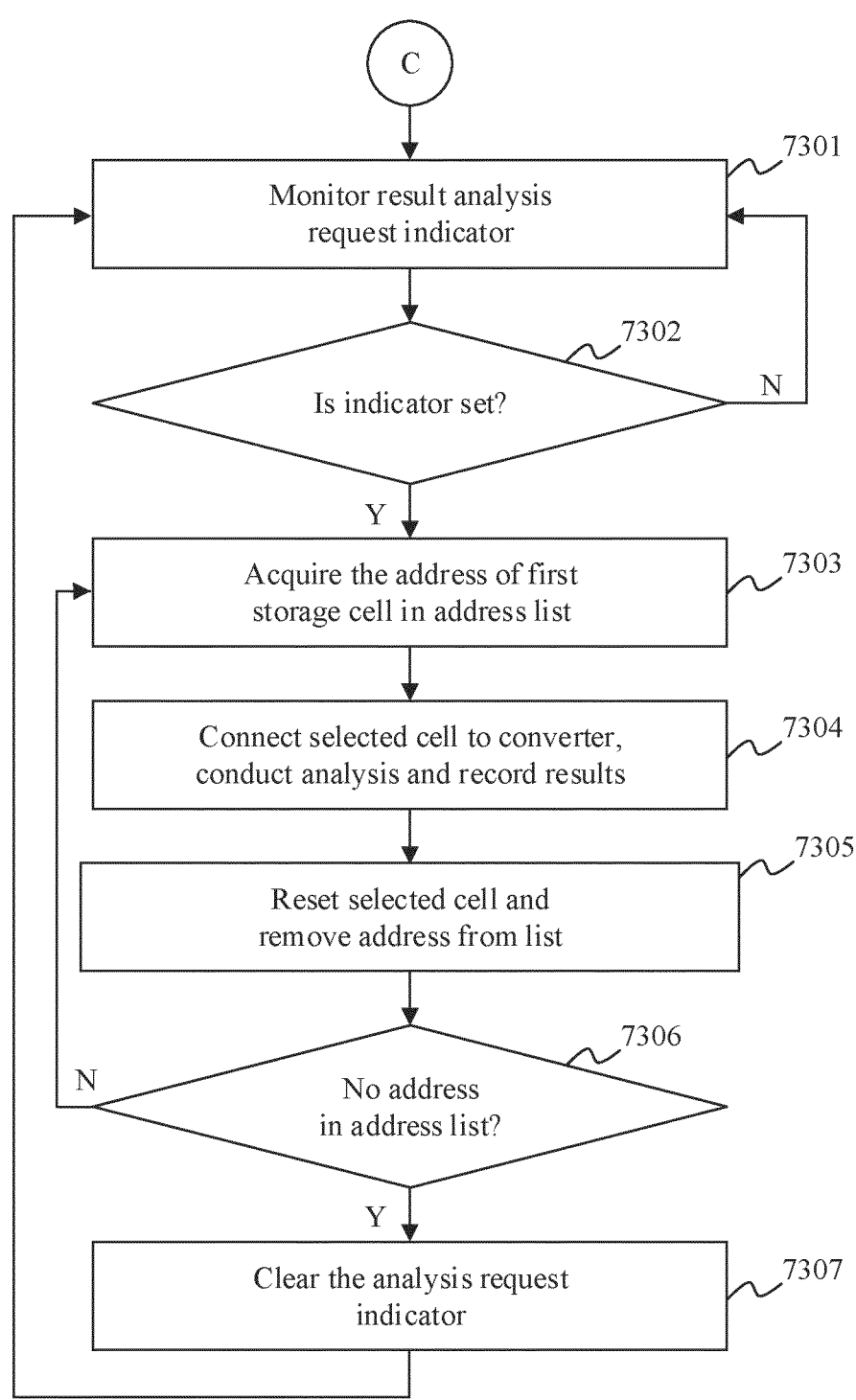

As shown in FIG. 7C, certain processing may follow step 603. Continuing from "C", method 600 may include a step 7301 of monitoring for an analysis request indicator. Step 7301 may include receiving a signal from control unit 490.

If it is determined in step 7302 that an analysis request indicator has not been received, the method may return to step 7301 and continue to monitor for an analysis request indicator.

If it is determined in step 7302 that an analysis request indicator has been received, the method may proceed to step 7303. Step 7303 may include acquiring addresses of storage cells in the address list.

In step 7304, interrogation may be performed, where interrogation may involve the obtaining of information (e.g., transmitting a signal) from a component, such as a storage cell. Step 7304 may include selecting a storage cell. For example, step 7304 may include actuating a switch to connect a storage cell to be interrogated with converter 450 (e.g., using switch $K_{31}$ in FIG. 5A). The storage cell to be interrogated may be the storage cell integrated in step 7203 (see FIG. 7B). A priority for interrogation may be based on a time period from when integration has been performed using a sensing element. For example, the next storage cell to be interrogated may be prioritized as the storage cell that has been waiting longest since being integrated.

Step 7304 may also include performing signal processing. Step 7304 may include using converter 450 to make determinations about the signal interrogated from the selected storage cell. For example, signals may be transmitted from first storage cell 441 to converter 450, wherein various comparison to reference values (e.g., $v_{refl1}$, $v_{refl2}$, $v_{refl3}$ in FIG. 5A) are made. Converter 450 may output data to control unit 490 that may be used to derive information about the electron arrival event (e.g., confirmation of the electron arrival event, whether one or more than one electron was received, or the specific energy level of the received electron, etc.).

In step 7305, the selected storage cell may be reset to release charges therefrom. Step 7305 may include actuating the reset switch of the selected storage cell.

Also in step 7305, the address of the selected storage cell may be removed from the address list. In step 7306, it may be determined whether further addresses are in the address list. If it is determined in step 7306 that there are addresses remaining in the address list, the method may return to step 7303 and acquire the address at the top of the list. If it is determined in step 7306 that no addresses remain in the address list, the method may proceed to step 7307 and the analysis request indicator may be cleared. After step 7307, the method may return to step 7301 and repeat.

Figure 7D:
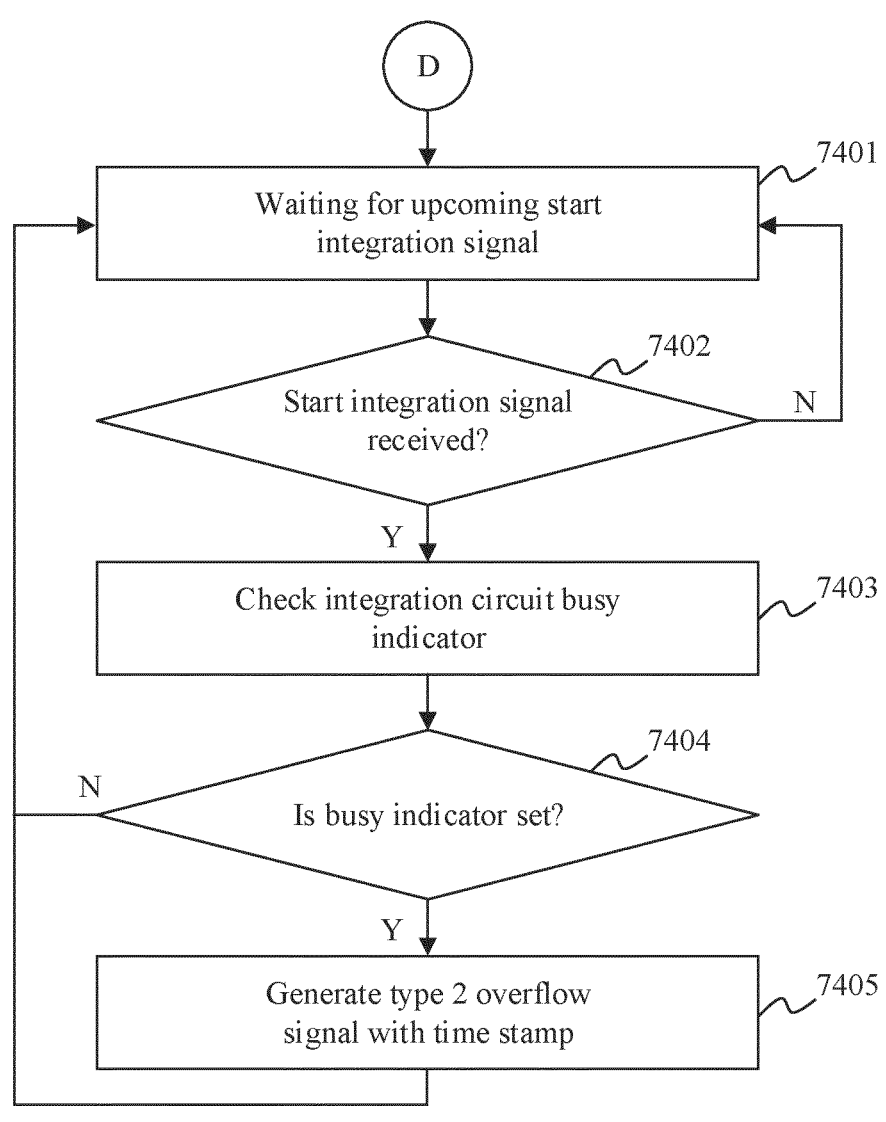

As shown in FIG. 7D, certain processing may follow step 604. Continuing from "D", method 600 may include a step 7401 of monitoring for an integration start signal. Step 7401 may be similar to step 7201 of FIG. 7B.

If it is determined in step 7402 that an integration start signal has not been received, the method may return to step 7401 and continue to monitor for an integration start signal.

If it is determined in step 7402 that an integration start signal has been received, the method may proceed to step 7403 and an integration circuit busy indicator may be checked. Step 7403 may include monitoring for a signal such as that generated in step 7206 (see FIG. 7B). For example, storage cell multiplexer 430 may select a storage cell of array 440 (see FIG. 4).

If it is determined in step 7404 that a busy indicator is not set, the method may return to step 7401 and continue to monitor for an upcoming integration start signal.

If it is determined in step 7404 that a busy indicator has been set, the method may proceed to step 7405 and an overflow signal may be generated. The overflow signal may be that associated with a second type of overflow such as that discussed herein. Step 7405 may include generating a time stamp associated with the overflow signal. After step 7405, the method may return to step 7401 and repeat.

Signal processing, such as that of step 7304 (see FIG. 7C) may require a certain amount of time. If signal processing with respect to a first storage cell (e.g., the storage cell interrogated in step 7304) has not completed by the time that integration of a new electron arrival event should begin, then a second storage cell may be selected for integration. For example, if signal processing is being performed on the first storage cell, and during that time sensing element signal level is measured and crosses the first threshold again, a storage cell different from the first storage cell may be selected for the next integration. As long as further storage cells are available, the next integration may proceed.

Method 600 may continue cycles of integrating and performing analysis (e.g., interrogating and signal processing) on storage cells. The speed of completing integration and signal processing may be different, however, and thus, it may be beneficial to have more storage cells available so as to receive signals from sensing element 311. Integration may then proceed uninterrupted while interrogation and signal processing may occur asynchronously. The greater the number of storage cells provided, the more integration that can be handled while signal processing of information from previous storage cells is ongoing. A detector may be able to handle a greater number of signals by using a circuit in such a manner.

Using method 600 and circuit 400, for example, electron counting may be enabled with dramatic improvement in SEM image SNR and overall throughput. Probe current range in which electron counting is enabled may be extended with improved energy measurement accuracy and reduced miscount rate.

Furthermore, in some embodiments, interconnections between circuits associated with individual sensing elements may be provided. A detector may include detection cells, each of which may include a sensing element and circuitry associated with the sensing element. For example, sensing element 311 and circuit 400 (see FIG. 4) may form a detection cell. The circuitry associated with each sensing element may include an analog signal processor, a data converter, and a local control unit. Interconnections may be provided between the circuitry of different detection cells. For example, interconnections may be provided between analog signal processors of neighboring detection cells, or between local control units of neighboring detection cells.

In some embodiments, a detector may include a pixilated array of sensing elements. The array of sensing elements may be formed in a two-dimensional plane. Thus, a sensing element may have one or more neighboring (e.g., adjacent) sensing elements. Interconnections between sensing elements may improve detection accuracy and enhance processing. Furthermore, in some embodiments, interconnections between sensing elements may enhance processing and may further improve reduction in miscounting rate. For example, interconnections may help to reduce miscounting in situations where a temporary ionization region induced by one incoming electron arrival event extends into the volumes of more than one sensing element.

Figure 8:
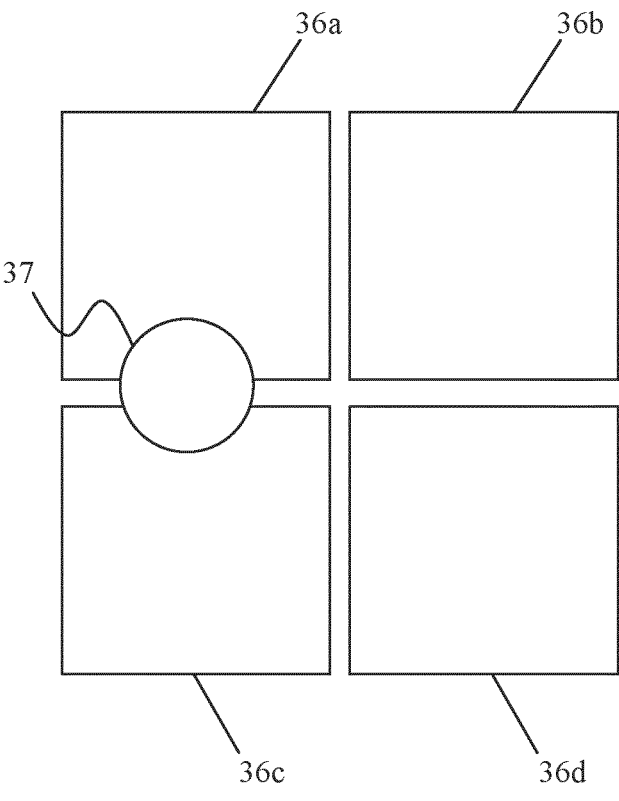
FIG. 8 illustrates an effect of a charged particle arrival event on a detection surface, consistent with embodiments of the present disclosure.

Reference is now made to FIG. 8, which illustrates an effect of a charged particle arrival event on a detection surface. In FIG. 8, a detector may include a plurality of sensing elements including sensing element 36a, sensing element 36b, sensing element 36c, and sensing element 36d. A charged particle may hit (e.g., impact) the detector surface in a region near a boundary between sensing element 36a and sensing element 36c. When an electron impacts a detector, it may create charge in a volume of the detector. The volume may span two or more sensing elements. For example, an ionized region 37 may develop that may enter into multiple sensing elements. Charge developing in multiple sensing elements may lead to an electron being counted multiple times or not being counted at all.

In some embodiments, interconnections may be helpful to reduce miscounting of electrons that reach a detection surface of a detector. Some miscounting may be based on electron arrival events that occur near the boundary between sensing elements. When electrons from an electron optical column of a SEM reach the sensing surface of a detector, the locations where the electrons enter the detector may be randomly distributed. Due to an ionization process after each electron enters the detector, a temporary ionized region within the detector may be created. The temporary ionized region may expand outside of a depletion region of a sensing element. For example, the temporary ionized region may: extend into the depletion region of a neighboring sensing element; extend into another region of the sensing element different from the depletion region; or extend into a region in the volume of a neighboring sensing element different from the depletion region of that sensing element. Expansion of the temporary ionized region into the depletion region of a neighboring sensing element may cause signal generation in the neighboring sensing element. Ionized regions formed upon each electron entering the detector may have a volume that relates to the energy of each incoming electron and the materials that form the detector. The randomness of the locations where each electron enters the detector may result in the temporarily ionized region induced by each incoming electron crossing the boundary of adjacent sensing elements. Thus, multiple sensing elements in the detector may generate output signals corresponding to a specific incoming electron. The individual output signals may less than that which would be generated had the temporary ionized region been contained in one sensing element, and the output signals may not reach a level high enough to trigger detection of an electron arrival event. Thus, the electron arrival event may go uncounted. Or, in some embodiments, the output signals of each of the multiple sensing elements may be high enough to trigger detection, and multiple detections may be registered for the same electron arrival event. Thus, miscounting may result.

To address the above issue, some embodiments may employ the following. A sensing element may be configured to have a predetermined size and shape. An array of sensing elements may include sensing elements that are arranged in a pattern, such as a grid. The size of each sensing element in the detector may be chosen in such a way that in any direction, the size of the sensing element is no less than a maximum penetration depth of the incoming electrons. The sensing element may be configured such that no dimension (e.g., a length, width, height) of the sensing element is less than the maximum penetration depth. The maximum penetration depth may be based on the materials used to form the detector. For example, an electron may penetrate further in one material than another. In this way, each incoming electron may impact no more than four sensing elements at a time. This may help to further enhance signal processing as will be discussed as follows.

Figure 9:
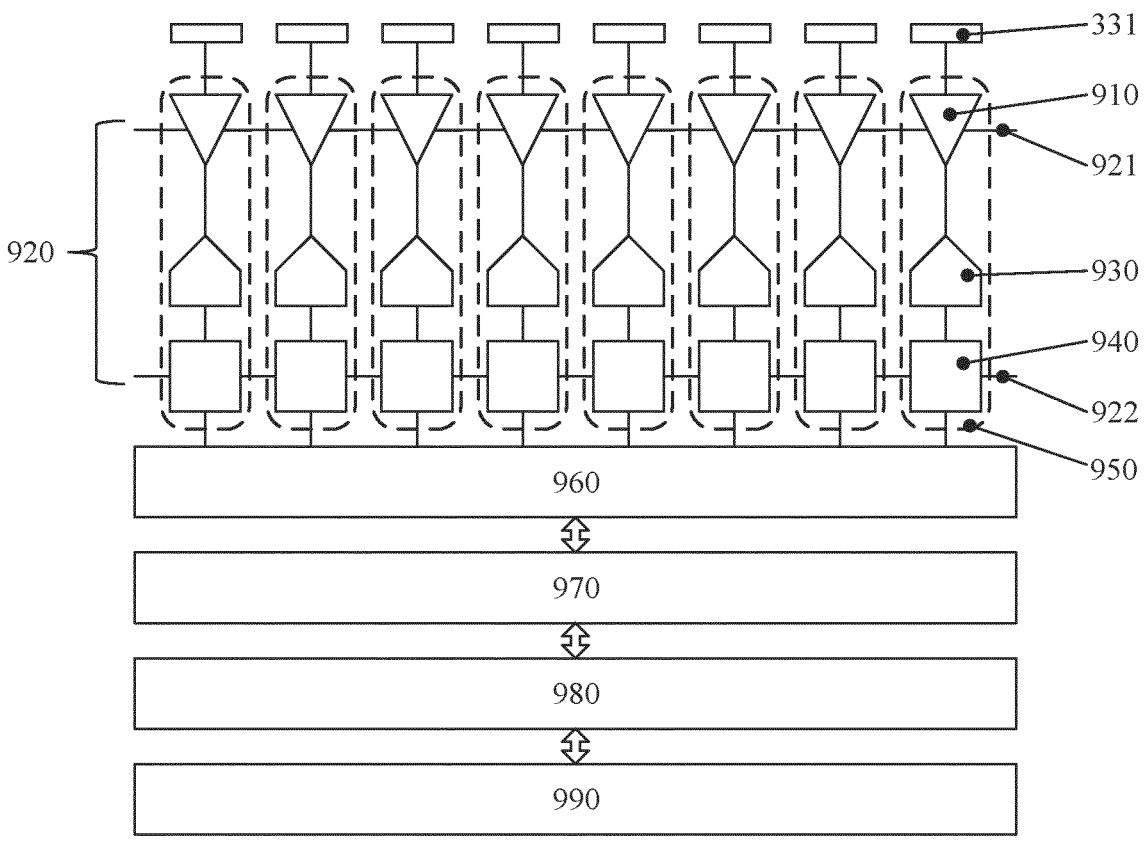
FIG. 9 is a diagrammatic representation of a detector with interconnected detection cells, consistent with embodiments of the disclosure.

Reference is now made to FIG. 9, which is a diagrammatic representation of a detector with interconnected detection cells, consistent with embodiments of the disclosure. FIG. 9 may represent a cross sectional view of a detector in a thickness direction of the detector. As shown in FIG. 9, a plurality of sensing elements including sensing element 331 may be provided in a detector. Each sensing element may be connected to a circuit. The circuit may include a sensing element level signal processing and control unit. For example, sensing element 331 is connected to a sensing element level signal processing and control unit 950. Sensing element 331 and sensing element level signal processing and control unit 950 may make up one detection cell. Sensing element level signal processing and control unit 950 may include an analog signal processor 910, a data converter 930, and a local control unit 940.

As shown in FIG. 9, multiple detection cells may be connected to various upper level components, such as a data routing layer 960. Data routing layer 960 may include a high-speed data routing layer. Data routing layer 960 may be connected to memory unit 970. Memory unit 970 may include a high-speed memory with memory controller.

Memory unit 970 may be connected to processor 980. Processor 980 may include a high-speed processor. Processor 980 may include controller 109 (see FIG. 1 or FIG. 3). Processor 980 may be connected to an interface 990. Interface 990 may include a high-speed interface. The term "upper level" may mean that certain processing functions are delegated to certain types of processors. Upper level components may be configured to perform processing based on information received from multiple lower level components. The upper level components may be configured to have a processing speed that enables the upper level components to handle outputs from the multiple lower level components connected thereto.

As shown in FIG. 9, between each two adjacent sensing element level signal processing and control units (including, e.g., unit 950), analog signals and data in digital form may be transferred through analog signal paths and data paths, respectively. There may be provided an interconnection 920. Interconnection 920 may include analog signal path 921 and data path 922.

Although illustrated as a one-dimensional array in FIG. 9, it will be understood that sensing elements and associated circuitry may be provided in a two-dimensional arrangement. A sensing element may be provided with its associated circuitry adjacent to the sensing element in the thickness direction of the detector, or some other direction. Sensing element level circuitry for each sensing element may be embedded in each sensing element. Each sensing element level signal processing and control unit may have multiple analog signal paths and data paths. Each of the multiple analog signal paths or data paths may be connected to one of the sensing element's neighboring sensing element level signal processing and control units. The electron sensing element array and the array of the sensing element level signal processing and control units may be formed on the same chip or on more than one chips.

Analog signal processor 910 may include input stage 410, storage cell multiplexer 430, and array 440 of storage cells discussed above with respect to FIG. 4. Furthermore, other analog signal routing multiplexers may be provided. For example, an analog signal routing multiplexer 460 may be provided (see FIG. 12A). In some embodiments, analog signal routing multiplexer 460 may be included in sensing element level signal processing and control unit 950. Analog signal routing multiplexer 460 may be part of analog signal processor 910. Analog signal routing multiplexer 460 may be arranged between array 440 of storage cells and converter 450. Analog signal routing multiplexer 460 may be configured to enable bidirectional analog signal flow between analog signal routing multiplexers and components of other (e.g., neighboring) sensing element level circuits, such as voltage detectors/ADCs in neighboring sensing element level circuits. The neighboring sensing element level circuits may be circuits of neighboring detection cells. Analog signal routing multiplexer 460 may be configured to transmit analog signals in the form of voltage, current, or charges that may represents the energy level of a specific electron incoming event.

An analog signal processing path may be formed by components of circuit 400 including input stage 410, storage cell multiplexer 430, array 440, analog signal routing multiplexer 460, and converter 450. Analog signal path 921 may be connected to analog signal processor 910 (e.g., may be connected to analog signal routing multiplexer 460 of FIG. 12A) and analog signal path 921 may be configured to communicate with analog signal routing multiplexers of other circuits (e.g., sensing element level circuits of neighboring detection cells). Analog signal routing multiplexer 460 may be connected to converter 450. In some embodiments, converter 450 may include an ADC. Data converter 930 of FIG. 9 may include such ADC. Data path 922 may be connected downstream from such ADC. For example, as shown in FIG. 4, converter 450 may connect to control unit 490. Local control unit 940 in FIG. 9 may include control unit 490. Data path 922, as shown in FIG. 9, may be connected to local control unit 940, and may be configured to communicate with control units of other circuits.

In some embodiments, an interconnection may be provided that includes an analog signal routing multiplexer configured to enable bidirectional analog signal flow between the interconnection and a sensing element level signal processing and control unit associated with another sensing element. The interconnection may include a data path configured to transmit digital data to a control unit associated with another sensing element.

As shown in FIG. 9, each sensing element level signal processing and control unit 950 may have a data communication link to data routing layer 960 following the sensing element level signal processing and control unit array. Memory unit 970 may be configured to organize and store data coming from the sensing element level signal processing and control unit array. Data routing layer 960 may be configured to manage transfer of data from the sensing element level signal processing and control unit array to memory unit 970.

Processor 980 may follow memory unit 970 and may be configured to perform data processing and operation control of the detector. For data processing, processor 980 may achieve data processing tasks including the following.

For example, processor 980 may be configured to perform SEM image pixel data generation based on predefined conditions, e.g.: pixel rate, pixel size, and sharpness. For each SEM image pixel, parameters such as the pixel size, pixel rate, and local sharpness may be the same in all frames of SEM images under certain conditions. In some embodiments, parameters may be different between frames of SEM images but kept the same within each SEM image. In some embodiments, parameters may be different from pixel to pixel within one SEM image.

Processor 980 may be configured to perform tuning of SEM image parameter and enhancement based on predefined conditions. Processor 980 may be configured to perform image brightness and contrast tuning, image sharpness enhancement, color SEM image generation based on the energy level of incoming electrons, etc.

Processor 980 may be configured to perform pre-inspection based on the acquired SEM image. Pre-inspection may include pattern recognition, edge extraction, etc.

Processor 980 may be configured to pass raw data of electron counting results without any manipulation.

Processor 980 may be configured to perform SEM projection tracking. SEM projection tracking may include generating information about the projection grid of beam spots formed on the detector (e.g., shape, size, location, distortion, movement and distortion prediction). SEM projection tracking may also include generating information about each of the beam spots (e.g., location, size, shape, and movement history), and future movement prediction. Furthermore, information such as that discussed above may be used to perform on-the-fly SEM image compensation. Processor 980 may be configured to determine a tradeoff between collection rate and crosstalk, or crosstalk reduction and collection rate enhancement based known SEM design.

Interface 990 may be configured to receive data from processor 980 and may perform further tasks, such as the following. For example, interface 990 may perform lossless data compression. Interface 990 may be configured to reduce the load of data links between the detector and upper level systems (e.g., a controller for the charged particle beam apparatus, or a general controller).

Interface 990 may perform data encoding for error correction. Interface 990 may be configured to reduce the error generated during the data transportation from the electron detection device to upper level systems.

In some embodiments, interface 990 may directly pass data to upper level systems without any processing. Interface 990 may include high speed transceivers and drivers to facilitate communication between the detector and upper level systems.

Figure 10:
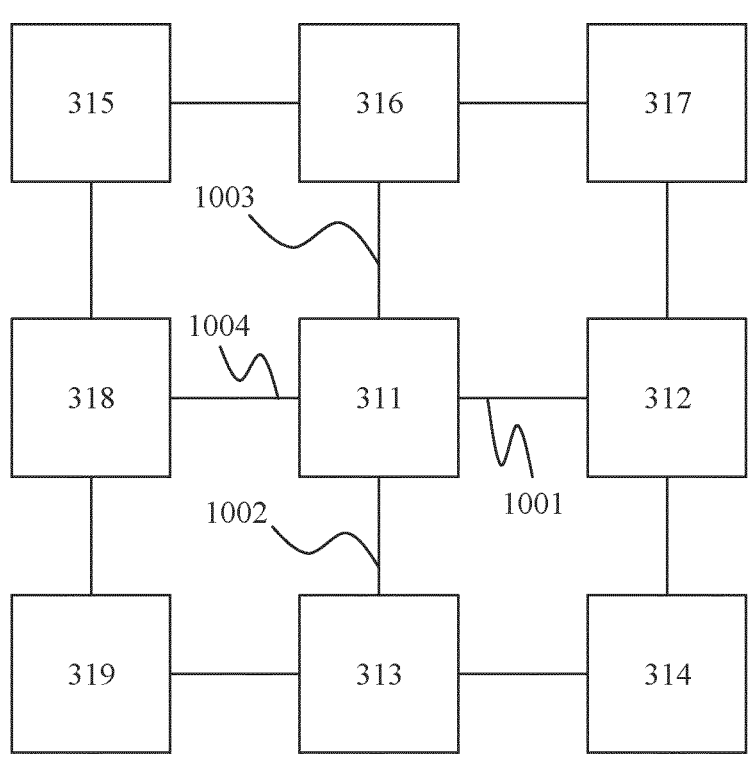
FIG. 10 illustrates an interconnection arrangement, consistent with embodiments of the disclosure.

Reference is now made to FIG. 10, which illustrates an interconnection arrangement, consistent with embodiments of the disclosure. Interconnections may be provided between each adjacent sensing element. A detector may include a two-dimensional array of sensing elements. The sensing elements of the array may have neighbors in the horizontal and vertical directions. For example, sensing element 311 may be adjacent to sensing elements 318 and 312 in the horizontal direction, and may be adjacent to sensing elements 313 and 316 in the vertical direction. Interconnection 1001 may be provided between sensing element 311 and sensing element 312.

Similarly, interconnection 1002 may be provided between sensing element 311 and sensing element 313, interconnection 1003 may be provided between sensing element 311 and sensing element 316, and interconnection 1004 may be provided between sensing element 311 and sensing element 318. It will be understood that interconnections in FIG. 10 may be between the circuitry associated with sensing elements and not the sensing elements themselves, directly.

Figure 11:
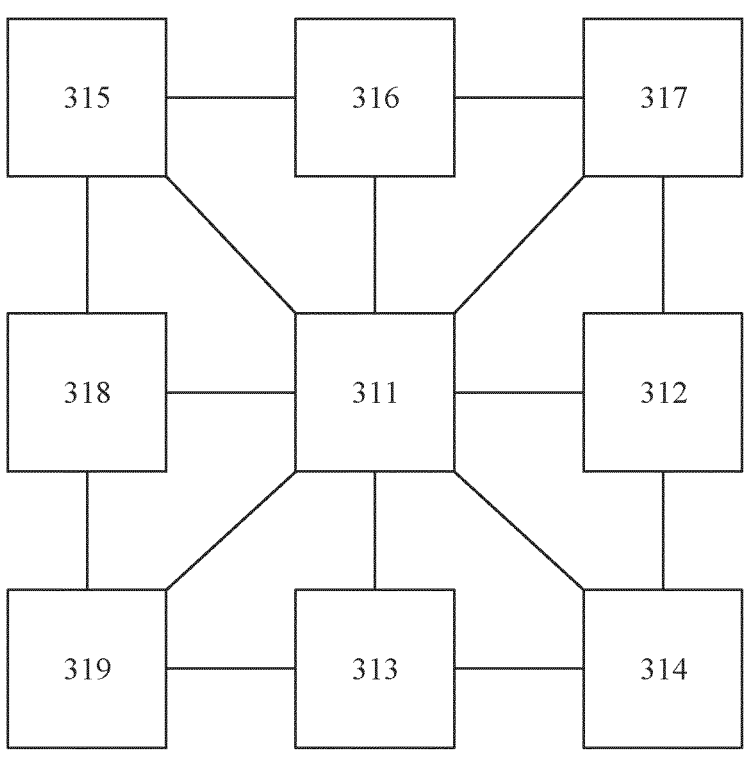
FIG. 11 illustrates an interconnection arrangement, consistent with embodiments of the disclosure.

Reference is now made to FIG. 11, which illustrates an interconnection arrangement, consistent with embodiments of the disclosure. Interconnections may be provided between sensing elements that are diagonally adjacent one another. Furthermore, in some embodiments, interconnections may be provided between sensing elements that are diagonally adjacent one another, and sensing elements that are adjacent in the horizontal and vertical directions. As shown in FIG. 11, interconnections may be provided such that the circuitry associated with sensing element 311 is connected to the circuitries associated with all of sensing elements 312 to 319. Interconnections shown in FIGS. 10 and 11 may correspond to interconnection 920 discussed above with reference to FIG. 9. For example, interconnection 1001 shown in FIG. 10 may include an analog signal path or a data path.

In some embodiments, interconnections may include switches. Flow of signals via the interconnections may be controlled. Control of the interconnections may be managed by a control unit such as control unit 490 or processor 980.

Figure 12A:
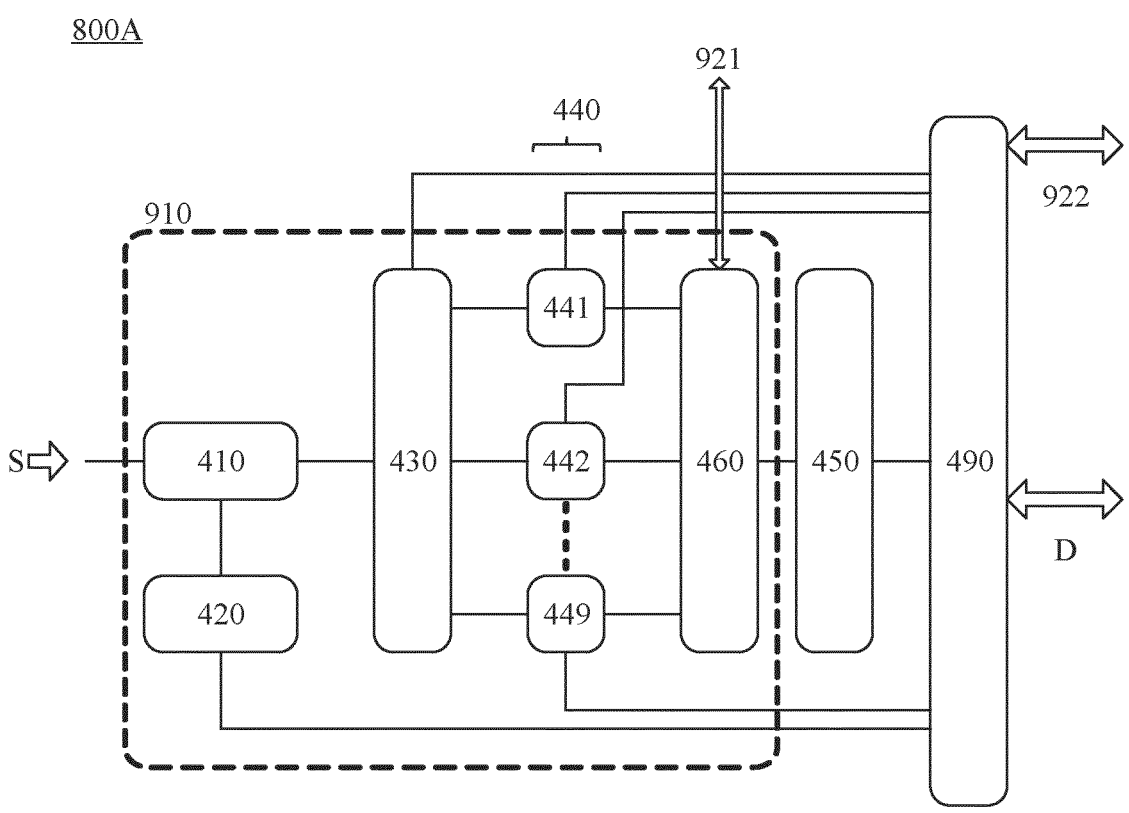
FIG. 12A illustrates a circuit with interconnections, consistent with embodiments of the disclosure.

Reference is now made to FIG. 12A, which illustrates a circuit 800A with interconnections, consistent with embodiments of the disclosure. Similar to FIG. 4, circuit 800A may include input stage 410, threshold detector 420, storage cell multiplexer 430, first storage cell 441 to Nth storage cell 449, converter 450, and control unit 490. Furthermore, circuit 800A may include analog signal routing multiplexer 460. Input stage 410 may be configured to receive a signal S from sensing element 311. Analog signal processor 910 may be formed by components including input stage 410, threshold detector 420, multiplexer 430, storage cells 441, 442 . . . 449, and analog signal routing multiplexer 460. Converter 450 may be configured to process analog signals from the storage cells of array 440 or analog signals passed to it from other sensing element circuits. Converter 450 may generate digital signals for data that represent the analog signals.

In some embodiments analog signal path 921 may be connected to analog signal routing multiplexer 460. In some embodiments, analog signal routing multiplexer 460 may be included in analog signal processor 910. Analog signal routing multiplexer 460 may be configured to perform analog signal routing. In some embodiments, converter 450 may include a voltage detector or ADC. Converter 450 may be configured to output data in digital format. Digital data may also be output by control unit 490. Data path 922 may be connected to control unit 490. In some embodiments, data path 922 may be connected to converter 450. Circuit 800A may correspond to sensing element level signal processing and control unit 950 discussed above with reference to FIG. 9.

As shown in FIG. 12A, circuit 800A may include bidirectional analog signal paths and bidirectional data paths. For example, analog signal path 921 and data path 922 may be provided. Such added paths may enable signal and data exchanges in both analog and digital forms between any two adjacent sensing element level signal processing and control units (see FIG. 9). Analog signal exchanges may be configured to transfer signals from adjacent electron sensing elements corresponding to a single electron incoming event associated with one of the sensing element level signal processing and control units so that signals may be added together in an analog way. Analog signal adding or processing using such analog signals may enhance processing resolution and accuracy. Signal adding may be performed in digital form by exchanging data in digital form between adjacent sensing element level signal processing and control units.

Analog signal path 921 may be configured to allow bidirectional analog signal flow between analog signal routing multiplexers of neighboring sensing element level circuits. For example, analog signal path 921 may be configured to communicate analog signals in the form of voltage, current, or charges that represent energy level of a particular charged particle arrival event. Data path 922 may be configured to allow bidirectional data flow between control units of neighboring sensing element level circuits. For example, data path 922 may be configured to communicate data of charged particle arrival events (including energy level, detection confirmation, time stamp, etc.). Control unit 490 may also be configured to allow bidirectional data flow to upper level components. Control unit 490 may be configured to transmit data D. Control unit 490 may be configured to control flow of (i) data to sensing elements (including timing information), (ii) counting results from sensing elements, and (iii) sensing element overflow flags with overflow type data.

In some embodiments, a digital signal processing method may provide additional information (e.g., besides information about energy level of the incoming electron) about the landing position of an electron on the detection surface. This may help improve the beam projection tracking accuracy and may also give additional information about the performance of the SEM system. In some embodiments, an analog signal processing method may include adding or processing signals from adjacent sensing elements. The analog method may be configured to prioritize accuracy. The analog method and the digital method may be used separately or in a combined way. In some embodiments, when signal adding of incoming electron event is desired, either the analog method or the digital method may be selected so that miscounting rate can be reduced and the energy level of each incoming electron can be correctly identified. In some embodiments, if the combined method is used, a first step may be to acquire digital form signals from all the sensing element level signal processing and control units that are involved in the process. Then, analog signal adding (or processing) may be performed. By using the combined method, benefits from both analog and digital methods may be gained. A detector may be configured to provide deeper analog signal pipeline in all the sensing element level signal processing and control units.

Figure 12B:
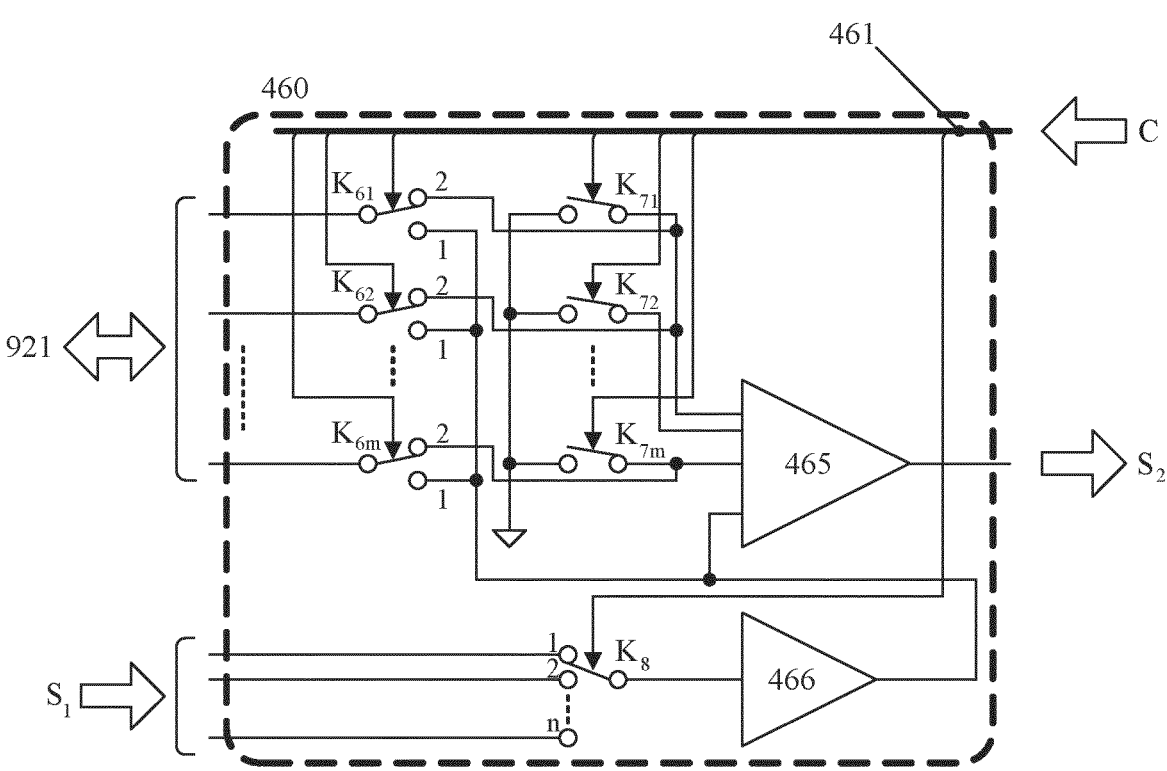
FIG. 12B is a diagrammatic representation of an analog signal routing multiplexer, consistent with embodiments of the present disclosure.

FIG. 12B is a diagrammatic representation of an analog signal routing multiplexer, consistent with embodiments of the present disclosure. FIG. 12B may represent another view of analog signal routing multiplexer 460 discussed above with reference to FIG. 12A. As shown in FIG. 12B, analog signal routing multiplexer 460 may include circuitry that may be used for routing and controlling signals. Analog signal routing multiplexer 460 may include various switches, wiring paths, and other electrical components, etc. Analog signal routing multiplexer 460 may include switches K61, K62, . . . K6m, switches K71, K72, . . . K7m, K8, and switch control signal bus 461 that may control the switches. Analog signal path 921 may be configured for bidirectional flow so that signal may be transmitted to and from neighboring cell circuits.

Furthermore, analog signal routing multiplexer 460 may include an amplifier 465 and a buffer 466. Amplifier 465 may include a summing amplifier. Buffer 466 may include a voltage buffer. Switch control signal bus 461 may be connected to control unit 490 (see FIG. 12A), and control unit 490 may be configured to control switches using switching control signal C. Switch $K_8$ may be configured to connect buffer 466 with one of the storage cells of array 440 such that a signal $S_1$ flows from a selected storage cell to buffer 466. It will be appreciated that some components of analog signal routing multiplexer 460 and converter 450 may be combined or overlap. For example, buffer 466 may include voltage buffer 451 (see FIGS. 5A-5C). Amplifier 465 may be connected to control unit 490 and may send a signal S2 to control unit 490.

Analog signal routing multiplexer 460 may be configured to operate in a plurality of scenarios. For example, in a first scenario, the sensing element level circuit is set to receive the analog signals from neighboring circuits: switches K61, K62, . . . K6m are set to position 2 and their corresponding switches K71, K72, . . . K7m are set to open for those analog signal paths through which the analog signals from neighboring circuits are sent. Some switches among K61, K62, . . . K6m may be set to position 2 and their corresponding switches among K71, K72, . . . K7m may be set to closed if the corresponding analog signal paths are not used to receive signals K8 is set to the position that connects the storage cell which stores signal of the event under processing.

In a second scenario, the sensing element level circuit is set to send the analog signal to neighboring circuits: switches K61, K62, . . . K6m are set to position 1 and their corresponding switches K71, K72, . . . K7m are set to closed for those analog signal paths through which the analog signals to neighboring circuits are sent. Some switches among K61, K62, . . . K6m may be set to position 2 and their corresponding switches among K71, K72, . . . K7m may be set to closed if the corresponding analog signal paths are not used to receive signals. K8 is set to the position that connects the storage cell which stores signal of the event under processing.

Figure 13:
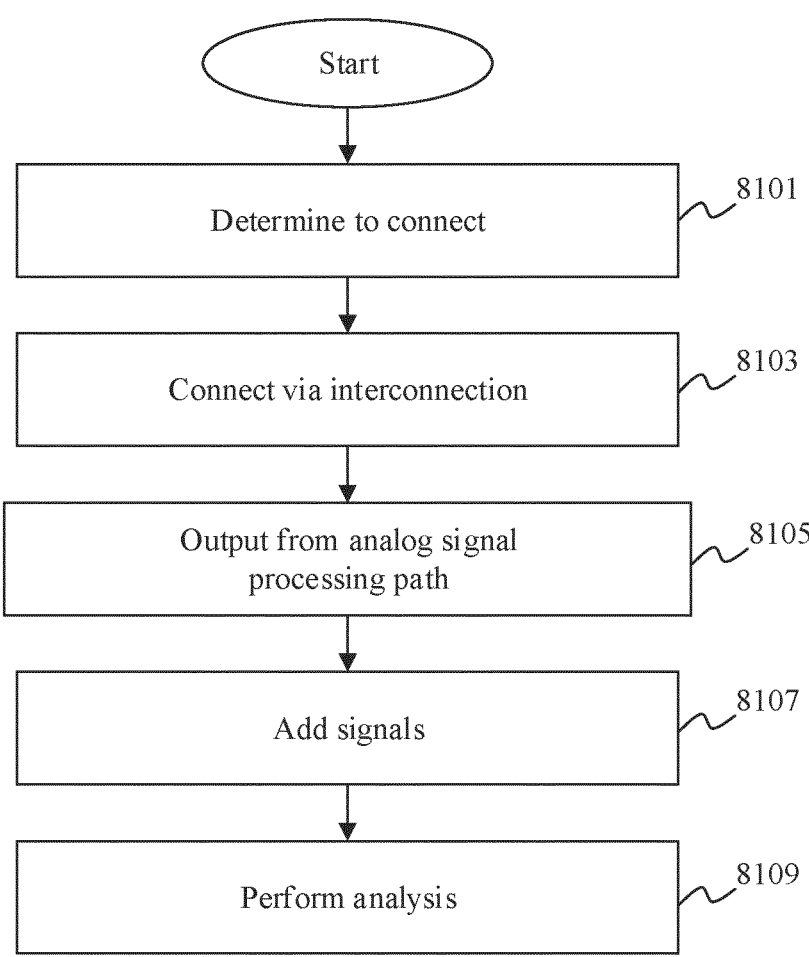
FIG. 13 is a flowchart illustrating a method that may be useful for electron counting, consistent with embodiments of the disclosure.

Reference is now made to FIG. 13, which is a flowchart illustrating a method 8000 that may be useful for electron counting, consistent with embodiments of the disclosure. Method 8000 may be performed by components including a circuit of a charged-particle inspection system (e.g., 800A in FIG. 12A), a controller such as controller 109 in FIG. 1 or FIG. 2B or control unit 490 of FIG. 4, FIGS. 5A-5C, and FIG. 12A, a processor such as processor 980, or combinations thereof. The components may include circuitry (e.g., a memory and a processor) programmed to implement method 8000. Method 8000 may include an analog signal processing method.

As shown in FIG. 13, method 8000 may begin at a "start" step. At the start step, a detection process may be already ongoing. Method 8000 may begin, for example, after step A and the processing of FIG. 7A has occurred.

Method 8000 may include a step 8101 of determining to connect circuits associated with different sensing elements. It may be determined to connect different detection cells. Step 8101 may include a first way of determining to connect or a second way of determining to connect, or other ways. The first way of determining to connect may include determining whether electron arrival events in neighboring detection cells are caused by the same incoming electron solely by comparing event start time. For example, if the start time is the same, the events may be determined to be caused by the same incoming electron. The second way of determining to connect may include determining whether events in neighboring detection cells are caused by the same incoming electron by comparing both the start time and stop time, or by using time periods of events. If the start time and stop time of both events is the same, the events may be determined to be caused by the same incoming electron. If the start times are the same and the events have the same duration, the events may be determined to be caused by the same incoming electron.

The first way of determining to connect may include determining that a start time of an electron arrival event in a first sensing element is substantially the same as that of an electron arrival event in a second sensing element. In some embodiments, the start time may be considered to be substantially the same if the times are within a predetermined amount of one another. The predetermined amount may be based on a clock speed of the detector, an average separation time of electron arrival events, or a parameter of sensing elements, such as a sensing element dead time. The predetermined amount may be a fraction of the average separation time of electron arrival events, for example.

In some embodiments, accuracy may be prioritized and the second way of determining to connect may be used. For example, the second way may enable higher accuracy and may involve more calculations than the first way. In some embodiments, response speed may be prioritized and the first way of determining to connect may be used. For example, the first way may enable lower power consumption and less latency than the second way. There may be a tradeoff relationship between parameters such as detection accuracy, process latency, and power consumption of a detection system. Such parameters may be changed on the fly by configuring the system to operate in one of the different modes. Furthermore, in some embodiments, longer latency may also cause higher possibility of type-2 overflow. To reduce the type-2 overflow due to longer latency, deeper analog pipelines in each detection cell may be used.

In some embodiments, step 8101 may be based on processing from FIG. 7A. For example, step 8101 may be based on a start integration signal or a time stamp from two or more different sensing elements. It may be determined that a start integration signal has been generated and that a start time stamp of different sensing elements are substantially the same, and that signals from the two sensing elements should be merged. Step 8101 may include comparing signals only from neighboring sensing elements. Neighboring sensing elements may be those that are adjacent to one another in the horizontal or vertical direction of the array of sensing elements on the detector. In some embodiments, neighboring sensing elements may include diagonally adjacent sensing elements. Step 8101 may be performed on a pair-wise basis (e.g., a determination is performed for two neighboring sensing elements, and another determination is performed for another two neighboring sensing elements). Step 8101 may be performed on a pair-wise basis when an analog signal processing method is used. In some embodiments, for example, when a digital signal processing method is used, step S8101 may be performed on a different basis.

Method 8000 may include a step 8103 of forming connections via interconnections. Step 8103 may include connecting neighboring detection cells using interconnection 920. Step 8103 may include actuating switches in interconnections. Step 8103 may include connecting neighboring detection cells using analog signal path 921.

Method 8000 may include a step 8105 of outputting signal from analog signal processing paths. Step 8105 may include outputting signal from converter 450. Step 8105 may include outputting signal from analog signal processor 910. Step 815 may include outputting signal from analog signal routing multiplexer 460. Step 8105 may include outputting signals from one or more detection cells. Step 8105 may include interrogation. Step 8105 may include selecting a storage cell via a switch, such as switch $K_{31}$ discussed above with respect to FIG. 5A. Step 8105 may include step 7304 discussed above with respect to FIG. 7C, and subsequent steps.

In some embodiments, an interconnection may be provided downstream from array 440 of storage cells and upstream from control unit 490. For example, an interconnected may be provided in the form of analog signal routing multiplexer 460 (see FIGS. 12A and 12B). In step 8105, signals from a storage cell may be tapped and may be transmitted through the interconnection to another detection cell where processing using components of the other detection cell may occur. The signal from the storage cell may be in an analog form. Analog signal routing may include performing signal adding, and switches in analog signal routing multiplexers of all detection cells involved may be controlled to select the storage cells that store the signals of the same electron arrival event at the same time. A detector may be configured to provide synchronization between all involved detection cells.

In some embodiments, signal routing may include performing digital signal processing. In some embodiments, digital interconnection may be used and the need for synchronization of cell selection and switch control may be eliminated.

Method 8000 may include a step 8107 of performing signal adding or processing. Step 8107 may include adding the signals of different detection cells. Signals from different detection cells may then be processed together. In some embodiments, the signals of the same electron arrival event from different detection cells may be added in step 8107.

Method 8000 may include a step 8109 of performing analysis. The analysis in step 8109 may be performed on the signal added or processed in step 8107. The analysis may be performed on an added signal. Signals from two or more detection cells may be added and then processed together.

A charged particle arrival event that occurs near a boundary of a sensing element may form an ionized region that expands into a volume of a neighboring sensing element. Signals generated in the neighboring sensing element may be added to those generated in the sensing element where the charged particle initially landed. The added signal may be processed, and the added signal may more accurately represent the single charged particle arrival event that occurred.

Analyzing the signal from two or more detection cells may involve using the same or different thresholds from those that would be used for analysis of a single detection cell. For example, a comparison may be made to a reference value (e.g., $v_{ref\,1}$ discussed above with reference to FIGS. 5A-5C). The reference value used in analyzing the signal from two or more detection cells may be the same, and the analyzed result may be more accurate. In some embodiments, the reference value may be adjusted to account for, for example, loss that may be involved when signals are transmitted through interconnections. An amount of adjustment may be determined through calibration. Calibration may include numerical simulation or experimentation, for example Converter 450 may include multiple reference values, and a desired reference value may be selected based on the circumstances for signal analysis.

Figure 14:
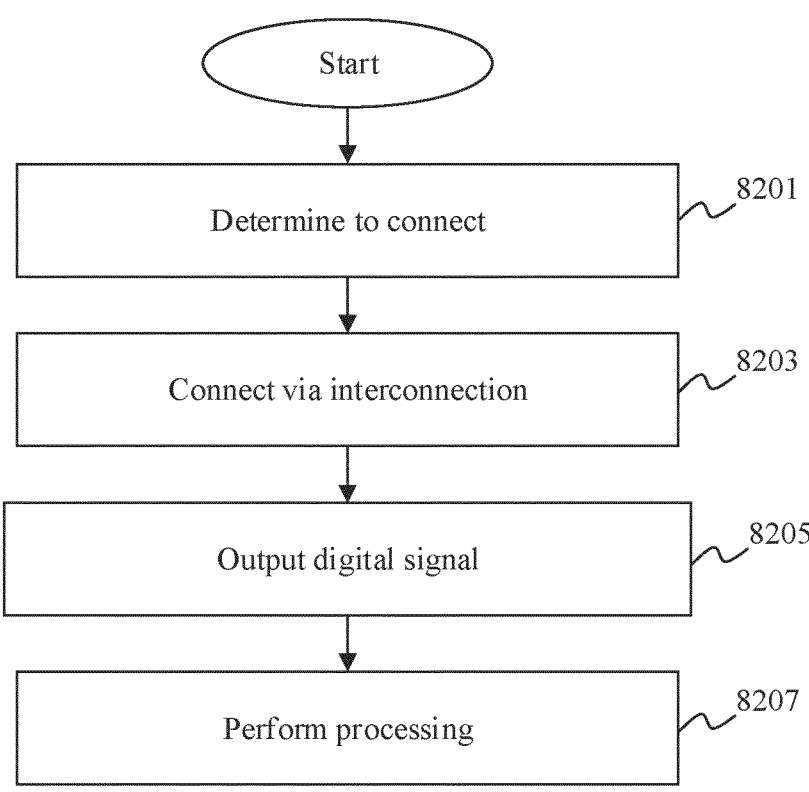
FIG. 14 is a flowchart illustrating a method that may be useful for electron counting, consistent with embodiments of the disclosure.

Reference is now made to FIG. 14, which is a flowchart illustrating a method 8200 that may be useful for electron counting, consistent with embodiments of the disclosure. Method 8200 may be performed by components including a circuit of a charged-particle inspection system, control unit, processor, or combinations thereof, similar to method 8000. Method 8200 may include digital signal processing method.

As shown in FIG. 14, method 8200 may begin at a "start" step. At the start step, a detection process may be already ongoing. Method 8200 may begin, for example, after step A and the processing of FIG. 7A has occurred.

Method 8200 may include a step 8201 of determining to connect circuits associated with different sensing elements. It may be determined to connect different detection cells. Step 8201 may be based on processing from FIG. 7A. Step 8201 may include a first way of determining to connect or a second way of determining to connect, or other ways, similar to step 8101 discussed above with respect to FIG. 13. For example, step 8201 may be based on a start integration signal or a time stamp from two or more different sensing elements. It may be determined that a start integration signal has been generated and that a start time stamp of different sensing elements are substantially the same, and that signals from the two sensing elements should be merged. Step 8201 may include comparing signals only from neighboring sensing elements. Neighboring sensing elements may be those that are adjacent to one another in the horizontal or vertical direction of the array of sensing elements on the detector. In some embodiments, neighboring sensing elements may include diagonally adjacent sensing elements. Step 8201 may be performed on a pair-wise basis (e.g., a determination is performed for two neighboring sensing elements, and another determination is performed for another two neighboring sensing elements), or some other basis.

Method 8200 may include a step 8203 of forming connections via interconnections. Step 8203 may include connecting neighboring detection cells using interconnection 920. Step 8203 may include actuating switches in interconnections. Step 8203 may include connecting neighboring detection cells using data path 922.

Method 8200 may include a step 8205 of outputting a digital signal. Step 8205 may include outputting signal from converter 450. Step 8205 may include outputting signal from data converter 930. Step 8205 may include outputting signals from one or more detection cells. Step 8205 may include interrogation. Step 8205 may include selecting a storage cell via a switch, such as switch $K_{31}$ discussed above with respect to FIG. 5A. A selected storage cell may be interrogated by a comparator, such as a voltage comparator. The output from step 8205 may be a digital signal that is transmitted over data path 922.

Method 8200 may include a step 8207 of performing processing. Step 8207 may include performing processing of digital signals from two or more detection cells. Step 8207 may include adding or filtering of some of the digital signals from the two or more detection cells. For example, it may be determined that a signal from one of the detection cells is associated with the same charged particle arrival event as that occurring in the other detection cell, and its signal may be disregarded. If, for example, both detection cells receive enough signal as to trigger the detection of a charged particle event, the charged particle event may be double-counted. To avoid such miscounting, step 8207 may include filtering out one of the counting results. In some embodiments, signals representing partial energies received by multiple detection cells may be processed so as to determine the energy of incoming electrons with improved accuracy. For example, signals from different detection cells may be added so that an energy level of an incoming electron may be determined accurately. Furthermore, combined signals may be generated from several signals relating to the same electron arrival event, and miscounting rate may be reduced.

Step 8207 may include performing processing using control unit 940 that may be a local or lower-level control unit. Processing of step 8207 may include distributed processing. Information such as address of sensing element or impingement location of a charged particle event may be determined locally. Then, further processing may occur using an upper-level control unit. For example, it may be determined locally between two detection cells that one detection cell receives a certain portion of the total energy of a charged particle arrival event (e.g., one third). Based on this, impingement location information may be determined. For example, it may be estimated that the charged particle arrived at a location one third of the way from the edge of the sensing element. Such determination may be performed in two dimensions. For example, such determination may be performed for two neighboring sensing elements in the horizontal direction, and for two neighboring sensing elements in the vertical direction. Based thereon, two-dimensional coordinates (e.g., x, y position) may be determined for the impingement location in the sensing element.

Figure 15:
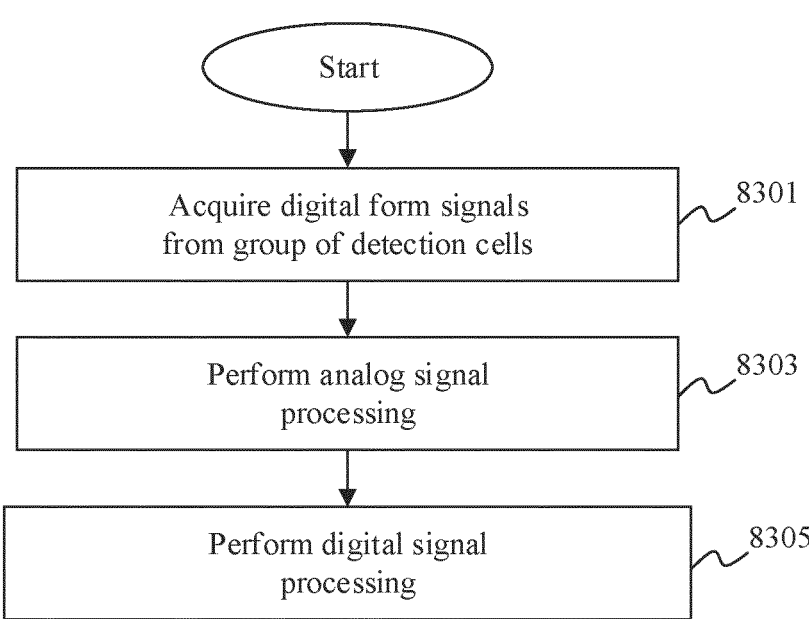
FIG. 15 is a flowchart illustrating a method that may be useful for electron counting, consistent with embodiments of the disclosure.

Reference is now made to FIG. 15, which is a flowchart illustrating a method 8300 that may be useful for electron counting, consistent with embodiments of the disclosure. Method 8300 may be performed by components including a circuit of a charged-particle inspection system, control unit, processor, or combinations thereof, similar to method 8000 or method 8200. Method 8300 may include a combined signal processing method (e.g., combining analog signal processing and digital signal processing).

As shown in FIG. 15, method 8300 may begin at a "start" step. At the start step, a detection process may be already ongoing. Method 8200 may begin, for example, after step A and the processing of FIG. 7A has occurred.

Method 8300 may include a step 8301 of acquiring digital form signals from a group of detection cells. In some embodiments, the group may include all the sensing element level signal processing and control units that are involved in processing of a particular subregion on the detector. Digital form signals from the group of detection cells may be used to perform preprocessing. In some embodiments, step 8301 may include determining to connect circuits associated with different sensing elements, similar to steps 8101 and 8201 discussed above with respect to FIGS. 13 and 14.

Method 8300 may include a step 8303 of performing analog signal processing. Step 8303 may include performing the method of FIG. 13.

Method 8300 may include a step 8305 of performing digital signal processing. Step 8305 may include performing the method of FIG. 14.

After performing method 8000, 8200, or 8300, further processing may be performed, such as data processing including SEM image pixel data generation, SEM image parameter tuning, pre-inspection, projection tracking, etc. The further processing may be performed by processor 980, for example. Furthermore, analog signal processing (e.g., step 8303 of FIG. 15) and digital signal processing (e.g., step 8305 of FIG. 15) may be performed together.

A method may include determining which of different processing modes, analog, digital, or combined, to use. Determining an operation mode may be controlled based on a processor different from that which may be used in performing the analog, digital, or combined processing modes. For example, an upper-level processor may determine which operation mode to use.

Furthermore, in some embodiments, a method may include determining which detection cell in which to perform processing. Determining which detection cell to use for processing may be based on the charged particle arrival event occurring in the vicinity of neighboring sensing elements. For example, the detection cell to use for processing may be determined based on the sensing element receiving the majority of energy of the charged particle arrival event. In some embodiments, the determination may be based on other factors, such as overflow or a busy signal indicator. If a detection cell is busy, the other one of the neighboring detection cells may be used. If two sensing elements receive approximately equal energy of a charged particle arrival event, and one is busy, it may be determined to use the other. Determination of which detection cell to use may takes into account processing load.

Aspects of the present disclosure are set out in the following numbered clauses:

1. A circuit for a charged particle detector comprising:
 a storage cell configured to receive a signal representing an output of a sensing element;
 a storage cell multiplexer configured to selectively transmit the signal representing the output of the sensing element to the storage cell;
 a threshold detector including circuitry configured to determine an integration start signal based on a comparison of the signal representing the output of the sensing element to a threshold; and
 a converter including circuitry configured to perform signal processing on a signal transmitted from the storage cell.

2. The circuit of clause 1, wherein the storage cell is one of a plurality of storage cells included in the circuit, wherein the plurality of storage cells are configured to receive signals representing outputs of the sensing element.

3. The circuit of clause 1 or clause 2, further comprising:
a control unit including circuitry configured to monitor a result analysis request indicator,
wherein the control unit is configured to:
  in response to determining that the result analysis request indicator is set, perform the signal processing on a first storage cell, and
  receive an output from the converter based on the signal processing.

4. The circuit of any one of clauses 1-3, further comprising:
circuitry configured to convert the output of the sensing element to an electrical signal of a different form.

5. The circuit of any one of clauses 1-4, wherein the multiplexer comprises a switch.

6. The circuit of any one of clauses 1-5, further comprising:
a switch configured to connect the storage cell to the converter, wherein the switch is configured to connect one storage cell at a time to the converter.

7. The circuit of any one of clauses 1-6, further comprising:
an input stage including circuitry configured to generate an output in proportion to current or charge received by the input stage from the sensing element.

8. The circuit of clause 7, wherein the input stage includes a current controlled current source configured to output an amplified signal based on the current or charge received by the input stage from the sensing element, and the threshold detector includes a current detector configured to compare the amplified signal to a current threshold.

9. The circuit of clause 7, wherein the input stage includes a transimpedance amplifier configured to output a voltage signal based on the current or charge received by the input stage from the sensing element, and the threshold detector includes a voltage comparator configured to compare the voltage signal to a reference.

10. The circuit of clause 3, wherein the control unit is configured to
receive the integration start signal,
receive an integration stop signal based on a comparison of the signal representing the output of the sensing element to a second threshold, and
in response to receiving the integration stop signal, control the storage cell multiplexer to change a connection state between the storage cell and the sensing element.

11. The circuit of clause 10, wherein the control unit is configured to
in response to receiving the integration stop signal, set an integration circuit busy indicator, and to maintain the integration circuit busy indicator until the connection state between the storage cell and the sensing element is changed.

12. The circuit of clause 3, wherein the control unit is configured to
in response to determining that the result analysis request indicator is set, acquiring an address of a storage cell to be interrogated from an address list.

13. A method comprising:
in response to a signal representing an output of a sensing element crossing a first threshold, performing integration of the signal representing the output of the sensing element using a first storage cell corresponding to a first charged particle event; and
in response to the signal representing the output of the sensing element crossing the first threshold after the first charged particle event, performing integration of the signal representing the output of the sensing element using a second storage cell corresponding to a second charged particle event.

14. The method of clause 13, further comprising:
generating an integration start signal when the output of the sensing element crosses the first threshold;
generating an integration stop signal when the output of the sensing element crosses a second threshold.

15. The method of clause 14, further comprising:
generating a first time stamp for the integration start signal and a second time stamp for the integration stop signal 16. The method of any one of clauses 13-15, further comprising:
changing a connection state of a storage cell multiplexer such that one of the first storage cell and the second storage cell is fed with signal from the sensing element.

17. The method of clause 16, wherein the signal from the sensing element fed to the one of the first storage cell and the second storage cell is an amplified signal.

18. The method of any one of clauses 13-16, further comprising:
changing a connection state of a switch such that one of the first storage cell or the second storage cell is connected to a converter configured to perform signal processing on a signal transmitted from the one of the first storage cell or the second storage cell.

19. The method of any one of clauses 13-18, further comprising:
comparing a signal transmitted from the first storage cell or the second storage cell to a reference.

20. The method of clause 19, wherein the reference is one of a plurality of references, and comparing the signal transmitted from the first storage cell or the second storage cell comprises comparing the signal transmitted from the first storage cell or the second storage cell to each of the plurality of references and outputting a result to a control unit.

21. The method of any of clauses 13-20, further comprising:
counting a number of charged particles received at the sensing element.

22. A non-transitory computer-readable medium storing a set of instructions that are executable by one or more processors of controller of a charged particle beam apparatus to cause the charged particle beam apparatus to perform a method comprising:
generating a charged particle beam;
when a signal representing an output of a sensing element of a detector exceeds a first threshold, integrating the signal representing the output of the sensing element using a first storage cell corresponding to a first charged particle event; and
when the signal representing the output of the sensing element exceeds the first threshold after the first charged particle event, integrating the signal representing the output of the sensing element using a second storage cell corresponding to a second charged particle event.

23. The medium of clause 22, wherein the set of instructions are executable to cause the charged particle beam apparatus to:
generate an integration start signal when the output of the sensing element crosses the first threshold; and
generate an integration stop signal when the output of the sensing element crosses a second threshold.

24. An electron counting detector comprising:

a storage cell;

a multiplexer configured to send a signal from an electron sensing element to the storage cell; and a voltage detector configured to detect a voltage of the storage cell to enable a determination of an energy level of an incoming electron.

25. The electron counting detector of clause 24, wherein the voltage detector is configured to determine a number of electrons detected during an electron arrival event.

26. The electron counting detector of clause 24 or clause 25, further comprising:

an input stage configured to amplify signal received from the electron sensing element and to output an amplified signal.

27. The electron counting detector of any of clauses 24-26, wherein the storage cell is one of a plurality of storage cells included in the electron counting detector, the multiplexer is configured to send the signal from the electron sensing element or its amplified form to any of the plurality of storage cells, and the multiplexer and the plurality of storage cells enable substantially continuous capture of the signal from the electron sensing element and associated counting of electrons.

28. The electron counting detector of any of clauses 24-27, further comprising:

a threshold detector configured to detect when the signal from the electron sensing element crosses a first threshold that indicates a start of an electron detection event, and crosses a second threshold that indicates an end of the electron detection event.

29. A detector for a charged particle beam apparatus, comprising:

a plurality of sensing elements;

a circuit for each of the sensing elements, the circuit comprising:

a storage cell configured to receive a signal representing an output of a sensing element;

a multiplexer configured to selectively feed the signal representing the output of the sensing element to the storage cell;

a threshold detector including circuitry configured to determine a start of integration corresponding to a charged particle arrival event; and a converter including circuitry configured to determine information about the charged particle arrival event.

30. The detector of clause 29, wherein the detector includes a segmented detector array.

31. The detector of clause 29 or clause 30, wherein the information includes an energy level of the charged particle arrival event.

32. The detector of any of clauses 29-31, wherein the information includes an overflow indicator.

33. The detector of clause 32, wherein the overflow indicator indicates whether more than a predetermined number of charged particles arrived during the charged particle arrival event.

34. The circuit of clause 8, wherein the current threshold includes a first threshold and a second threshold.

35. The detector of clause 29, wherein the threshold detector includes circuitry configured to determine a stop of integration corresponding to the charged particle arrival event.

36. The circuit of clause 3, wherein the result analysis request indicator is set in response to receiving an integration stop signal after the integration start signal.

37. The circuit of clause 4, wherein the output of the sensing element being converted to an electrical signal of the different form includes the output of the sensing element being converted to a voltage.

38. The circuit of clause 4, wherein the output of the sensing element being converted to an electrical signal of the different form includes the output of the sensing element being converted to an amplified current.

39. An electron counting detector comprising:

an input stage configured to amplify charge signal received from an electron sensing element and to output an amplified charge signal;

a charge storage cell;

a mux configured to send the amplified charge signal to the charge storage cell; and a voltage detector configured to detect a voltage of the charge storage cell to enable a determination of a number of electrons detected.

40. The detector of clause 39, wherein the charge storage cell is one of multiple charge storage cells, the mux is configured to send the amplified charge signal to any one of the multiple charge storage cells, and the mux and the multiple charge storage cells enable substantially continuous capture of the amplified charge signal and associated counting of electrons.

41. The detector of clause 39 or clause 40, further comprising:

a threshold detector configured to detect:

when the charge signal received from the electron sensing element crosses a first threshold that indicates a start of an electron detection event, and when the charge signal received from the electron sensing element crosses a second threshold that indicates an end of the electron detection event.

42. The detector of clause 41, wherein the mux is configured to change a connection state between the input stage and the multiple charge storage cells in response to the threshold detector detecting the charge signal received from the electron sensing element crosses the second threshold.

43. The detector of clause 41 or 42, further comprising:

a control unit configured to monitor a result analysis request indicator, and in response to determining that the result analysis request indicator is set, the voltage detector detects the voltage of the charge storage cell.

44. The detector of clause 40, wherein the configuration of the voltage detector further enables a determination of whether the detected electrons are each a backscattered electron or a secondary electron.

45. The detector of clause 40, wherein the configuration of the voltage detector further enables a determination of an energy level of the detected electrons.

46. The circuit of any of clauses 1-12, 34, or 36-38, further comprising:

an interconnection configured to transmit an analog signal from the storage cell to a circuit of another detection cell.

47. The circuit of clause 46, wherein the circuit of another detection cell includes an analog signal routing multiplexer.

48. The circuit of clause 46, wherein the interconnection includes a data path configured to transmit digital data to a control unit of another detection cell.

49. The electron counting detector of any of clauses 24-28, further comprising:

an interconnection configured to transmit an analog signal from the storage cell or a digital signal that includes the voltage of the storage cell to a circuit of another detection cell.

50. The detector of any of clauses 29-33 or 35, further comprising:

an interconnection configured to transmit an analog signal from the storage cell or a data signal determined by the converter to a circuit of another detection cell.

51. The detector of any of clauses 39-45, further comprising:

an interconnection configured to transmit an analog signal from the charge storage cell or a data signal including the voltage of the charge storage cell to a circuit of another detection cell.

52. The electron counting detector of clause 49, wherein the other electron sensing element includes a neighboring sensing element in a horizontal direction, vertical direction, or diagonal direction of the electron counting detector.

53. The detector of clause 50, wherein the other detection cell includes a neighboring detection cell in a horizontal direction, vertical direction, or diagonal direction of the detector.

54. The detector of clause 51, wherein the other detection cell includes a neighboring detection cell in a horizontal direction, vertical direction, or diagonal direction of the detector.

55. A circuit for a charged particle detector comprising:

a storage cell configured to receive a signal representing an output of a sensing element;

a storage cell multiplexer configured to selectively transmit the signal representing the output of the sensing element to the storage cell;

an interconnection configured to transmit an output of the storage cell to a sensing element level signal processing and control unit of another detection cell.

56. The circuit of clause 55, further comprising:

a converter including circuitry configured to perform signal processing on a signal transmitted from the storage cell.

57. The circuit of clause 56, wherein the interconnection is downstream from a voltage comparator or ADC included in the converter.

58. The circuit of any of clauses 55-57, wherein the interconnection is configured to transmit an analog signal from the storage cell to a circuit of another detection cell.

59. The circuit of any of clauses 55-57, wherein the interconnection includes a data path configured to transmit digital data to a control unit of another detection cell.

60. The circuit of any of clauses 46-48, wherein the another detection cell includes a neighboring detection cell in a horizontal direction, vertical direction, or diagonal direction.

61. A circuit for a charged particle detector comprising:

a sensing element level signal processing and control unit including circuitry configured to perform signal processing on a signal transmitted from a storage cell that is configured to receive a signal representing an output of a sensing element in response to a charged particle arrival event; and an interconnection configured to connect an analog signal path or a data path from another sensing element.

62. The circuit of clause 61, wherein the interconnection includes:

an analog signal path configured to transmit an analog signal from the storage cell to a circuit of another detection cell; or a data path configured to transmit digital data to a control unit associated with another sensing element.

63. The circuit of clause 61 or 62, further comprising:

a local control unit configured to perform processing using a signal from a storage cell of a first detection cell and a signal from a storage cell of a second detection cell.

64. The circuit of any of clauses 61-63, wherein the analog signal routing multiplexer is connected to a converter configured to receive an added signal that includes the signal transmitted from the storage cell and a signal transmitted from a storage cell of the other sensing element.

65. The circuit of clause 64, wherein the other sensing element includes a neighboring sensing element.

66. A method of determining a number of charged particles, comprising:

connecting a first circuit associated with a first sensing element and a second circuit associated with a second sensing element via an interconnection, performing processing based on a first signal from the first circuit and a second signal from the second circuit using the first circuit, and determining the number of charged particles based on the processing.

67. The method of clause 66, wherein the processing includes:

determining an energy level of an incident charged particle included in the number of charged particles.

68. The method of clause 66 or clause 67, wherein the processing includes:

adding the first signal and the second signal to form an added signal, and determining whether the added signal crosses a threshold.

69. The method of clause 66, wherein the first signal and the second signal are digital signals and the processing includes adding or filtering the first signal or the second signal.

70. The method of any of clauses 66-69, further comprising determining to connect the first circuit and the second circuit.

71. The method of clause 70, wherein determining to connect the first circuit and the second circuit is based on time stamps or energy levels of charged particle arrival events occurring in each of the first sensing element and second sensing element.

72. The method of clause 71, wherein determining to connect the first circuit and the second circuit includes:

determining that a start time of an electron arrival event in the first sensing element is substantially the same as that of an electron arrival event in the second sensing element.

73. The method of clause 72, wherein determining to connect the first circuit and the second circuit includes:

determining that a stop time of the electron arrival event in the first sensing element is substantially the same as that of the electron arrival event in the second sensing element.

74. The method of clause 72, wherein determining to connect the first circuit and the second circuit includes:

determining that a time period of the electron arrival event in the first sensing element is substantially the same as that of the electron arrival event in the second sensing element.

75. The method of any of clauses 66-74, further comprising:

actuating a switch to connect the interconnection.

76. The method of any of clauses 66-75, further comprising:

determining an address of a sensing element receiving a charged particle.

77. The method of any of clauses 66-76, further comprising:

determining an impingement location of a charged particle.

78. A computer readable medium storing a set of instructions that are executable by one or more processors of a system to cause the system to perform a method comprising:

connecting a first circuit associated with a first sensing element and a second circuit associated with a second sensing element via an interconnection, performing processing based on a first signal from the first circuit and a second signal from the second circuit using the first circuit, and determining the number of charged particles based on the processing.

79. The medium of clause 78, wherein the processing includes:

determining an energy level of an incident charged particle included in the number of charged particles.

80. The medium of clause 78 or clause 79, wherein the processing includes:

adding the first signal and the second signal to form an added signal, and determining whether the added signal crosses a threshold.

81. The medium of clause 80, wherein the first signal and the second signal are digital signals and the processing includes adding or filtering the first signal or the second signal.

82. The medium of any of clauses 78-81, wherein the set of instructions are executable by one or more processors of the system to cause the system to further perform:

determining to connect the first circuit and the second circuit.

83. The medium of clause 82, wherein determining to connect the first circuit and the second circuit is based on time stamps or energy levels of charged particle arrival events occurring in each of the first sensing element and second sensing element.

84. The medium of any of clauses 78-83, wherein the set of instructions are executable by one or more processors of the system to cause the system to further perform:

actuating a switch to connect the interconnection.

85. The medium of any of clauses 78-84, wherein the set of instructions are executable by one or more processors of the system to cause the system to further perform:

determining an address of a sensing element receiving a charged particle.

86. The medium of any of clauses 78-85, wherein the set of instructions are executable by one or more processors of the system to cause the system to further perform:

determining an impingement location of a charged particle.

A non-transitory computer-readable medium may be provided that stores instructions for a processor of a controller (e.g., controller 109 in FIG. 1) for detecting charged particles according to the exemplary flowchart of FIGS. 6, 13-15, consistent with embodiments of the present disclosure. For example, the instructions stored in the non-transitory computer-readable medium may be executed by the circuitry of the controller for performing method 600 in part or in entirety. Common forms of non-transitory media include, for example, a floppy disk, a flexible disk, hard disk, solid-state drive, magnetic tape, or any other magnetic data storage medium, a Compact Disc Read-Only Memory (CD-ROM), any other optical data storage medium, any physical medium with patterns of holes, a Random Access Memory (RAM), a Programmable Read-Only Memory (PROM), and Erasable Programmable Read-Only Memory (EPROM), a FLASH-EPROM or any other flash memory, Non-Volatile Random Access Memory (NVRAM), a cache, a register, any other memory chip or cartridge, and networked versions of the same.

Block diagrams in the figures may illustrate the architecture, functionality, and operation of possible implementations of systems, methods, and computer hardware or software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes can be made without departing from the scope thereof. For example, a charged particle inspection system may be but one example of a charged particle beam system consistent with embodiments of the present disclosure.

The invention claimed is:

1. A circuit for a charged particle detector comprising:

a storage cell configured to receive a signal representing an output of a sensing element;

a storage cell multiplexer configured to selectively transmit the signal representing the output of the sensing element to the storage cell;

a threshold detector including circuitry configured to determine an integration start signal based on a comparison that indicates that the signal representing the output of the sensing element exceeds a threshold; and a converter including circuitry configured to perform signal processing on a signal transmitted from the storage cell.

2. The circuit of claim 1, wherein the storage cell is one of a plurality of storage cells included in the circuit, wherein the plurality of storage cells are configured to receive signals representing outputs of the sensing element.

3. The circuit of claim 1, further comprising:

a control unit including circuitry configured to monitor a result analysis request indicator, wherein the control unit is configured to:

in response to determining that the result analysis request indicator is set, perform the signal processing on a first storage cell, and receive an output from the converter based on the signal processing.

4. The circuit of claim 1, further comprising:

circuitry configured to convert the output of the sensing element to an electrical signal of a different form.

5. The circuit of claim 1, wherein the multiplexer comprises a switch.

6. The circuit of claim 1, further comprising:

a switch configured to connect the storage cell to the converter, wherein the switch is configured to connect one storage cell at a time to the converter.

7. The circuit of claim 1, further comprising:

an input stage including circuitry configured to generate an output in proportion to current or charge received by the input stage from the sensing element.

8. The circuit of claim 7, wherein the input stage includes a current controlled current source configured to output an amplified signal based on the current or charge received by the input stage from the sensing element, and the threshold detector includes a current detector configured to compare the amplified signal to a current threshold.

9. The circuit of claim 7, wherein the input stage includes a transimpedance amplifier configured to output a voltage signal based on the current or charge received by the input stage from the sensing element, and the threshold detector includes a voltage comparator configured to compare the voltage signal to a reference.

10. The circuit of claim 3, wherein the control unit is configured to receive the integration start signal, receive an integration stop signal based on a comparison of the signal representing the output of the sensing element to a second threshold, and in response to receiving the integration stop signal, control the storage cell multiplexer to change a connection state between the storage cell and the sensing element.

11. The circuit of claim 10, wherein the control unit is configured to in response to receiving the integration stop signal, set an integration circuit busy indicator, and to maintain the integration circuit busy indicator until the connection state between the storage cell and the sensing element is changed.

12. The circuit of claim 3, wherein the control unit is configured to in response to determining that the result analysis request indicator is set, acquiring an address of a storage cell to be interrogated from an address list.

13. A non-transitory computer-readable medium storing a set of instructions that are executable by one or more processors of controller of a charged particle beam apparatus to cause the charged particle beam apparatus to perform a method comprising:

generating a charged particle beam;

when a signal representing an output of a sensing element of a detector exceeds a first threshold, integrating the signal representing the output of the sensing element using a first storage cell corresponding to a first charged particle event; and when the signal representing the output of the sensing element exceeds the first threshold after the first charged particle event, integrating the signal representing the output of the sensing element using a second storage cell corresponding to a second charged particle event.

14. The medium of claim 13, wherein the set of instructions are executable to cause the charged particle beam apparatus to:

generate an integration start signal when the output of the sensing element crosses the first threshold; and generate an integration stop signal when the output of the sensing element crosses a second threshold.

15. The medium of claim 14, wherein the set of instructions are executable to cause the charged particle beam apparatus to:

generate a first time stamp for the integration start signal and a second time stamp for the integration stop signal.

16. A detector for a charged particle beam apparatus, comprising:

a plurality of sensing elements;

a circuit for each of the sensing elements, the circuit comprising:

a storage cell configured to receive a signal representing an output of a sensing element;

a multiplexer configured to selectively feed the signal representing the output of the sensing element to the storage cell;

a threshold detector including circuitry configured to determine a start of integration corresponding to a charged particle arrival event based on a comparison that indicates that the signal representing the output of the sensing element exceeds a threshold; and a converter including circuitry configured to determine information about the charged particle arrival event.

17. The detector of claim 16, wherein the detector includes a segmented detector array.

18. The detector of claim 16, wherein the information includes an energy level of the charged particle arrival event.

19. The detector of claim 16, wherein the information includes an overflow indicator.

20. The detector of claim 19, wherein the overflow indicator indicates whether more than a predetermined number of charged particles arrived during the charged particle arrival event.

* * * * *